(12) United States Patent
Hidaka

(10) Patent No.: US 7,085,174 B2
(45) Date of Patent: Aug. 1, 2006

(54) SEMICONDUCTOR MEMORY DEVICE WITH CURRENT DRIVER PROVIDING BI-DIRECTIONAL CURRENT TO DATA WRITE LINE

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 14 days.

(21) Appl. No.: 10/885,706

(22) Filed: Jul. 8, 2004

(65) Prior Publication Data

US 2005/0007834 A1 Jan. 13, 2005

(30) Foreign Application Priority Data

Jul. 8, 2003 (JP) .............................. 2003-193762

(51) Int. Cl.
*G11C 7/00* (2006.01)
(52) U.S. Cl. ................. 365/189.09; 365/158; 365/171; 365/189.11
(58) Field of Classification Search ................ 365/158, 365/171, 173
See application file for complete search history.

(56) References Cited

U.S. PATENT DOCUMENTS 6,661,689 B1 * 12/2003 Asao et al. .................... 365/63
6,693,822 B1 * 2/2004 Ito .............................. 365/158
6,879,513 B1 * 4/2005 Ooishi ......................... 365/158

FOREIGN PATENT DOCUMENTS

JP 2002-93144 3/2002

OTHER PUBLICATIONS

R. Scheuerlein et al., "A 10ns Read and Write Non-Volatile Memory Array Using a Magnetic Tunnel Junction and FET Switch in each Cell", ISSCC Digest of Technical Papers, 2000 IEEE International Solid-State Circuits Conference., TA 7.2, Feb. 2000.
M. Durlam et al., "Nonvolatile RAM based on Magnetic Tunnel Junction Elements", ISSCC Digest of Technical Papers, 2000 IEEE International Solid-State Circuits Conference, TA 7.3, Feb. 2000.
P.K. Naji et al., "A 256kb 3.0V 1T1MTJ Nonvolatile Magnetoresistive RAM", ISSCC Digest of Technical Papers, 2001 IEEE International Solid-State Circuits Conference, TA 7.6, Feb. 2001.

* cited by examiner

*Primary Examiner*—Tan T. Nguyen
(74) *Attorney, Agent, or Firm*—McDermott Will & Emery LLP

(57) ABSTRACT

First and second current drivers are connected to one end of corresponding first and second write bit lines, respectively, and the first and second write bit lines are directly connected, at the other end, to a common line. The first and second current drivers receive a first power supply voltage and the ground voltage, while the common line receives a second power supply voltage higher than the ground voltage and lower than the first power supply voltage. The first and second current drivers cause a current for data writing to flow in a first direction based on a voltage difference between the first power supply voltage and the second power supply voltage, and cause a current for data writing to flow in a second direction based on a voltage difference between the second power supply voltage and the ground voltage.

22 Claims, 21 Drawing Sheets

SEMICONDUCTOR MEMORY DEVICE WITH CURRENT DRIVER PROVIDING BI-DIRECTIONAL CURRENT TO DATA WRITE LINE

BACKGROUND OF THE INVENTION

1. Field of the Invention

The present invention relates to a semiconductor memory device and, particularly, to a semiconductor memory device including a current driver that causes bi-directional current to flow through a data write line to write data into a memory cell.

2. Description of the Background Art

An MRAM (Magnetic Random Access Memory) has been attracting attention as a non-volatile memory device with low power consumption. An MRAM is a memory device in which non-volatile data storage is realized by using a plurality of thin film magnetic bodies and each of the thin film magnetic bodies can be accessed at random.

Recently, it has been reported that MRAM performance can remarkably be improved by using a thin film magnetic body utilizing magnetic tunnel junction (MTJ) as a memory cell. MRAMs including memory cells having the magnetic tunnel junction are disclosed in "A 10 ns Read and Write Non-Volatile Memory Array Using a Magnetic Tunnel Junction and FET Switch in each Cell," ISSCC Digest of Technical Papers, TA7. 2, Feb. 2000, "Nonvolatile RAM based on Magnetic Tunnel Junction Elements," ISSCC Digest of Technical Papers, TA7. 3, Feb. 2000, and "A 256 kb 3.0V 1T1MTJ Nonvolatile Magnetoresistive RAM," ISSCC Digest of Technical Papers, TA7. 6, Feb. 2001.

In an MRAM including memory cells having magnetic tunnel junction (hereinafter also simply referred to as "MTJ memory cells"), at the time of data writing, a current is caused to flow through a selected bit line in a direction in accordance with the write data, and a non-selected bit line is kept in a floating state, by a current driver operating with a prescribed power supply voltage supplied thereto. As a prescribed amount of current flows through the selected bit line, a direction of magnetization of a ferromagnetic layer referred to as a free magnetization layer changes in the memory cell to which data is to be written (hereinafter also referred to as a "selected memory cell"). Utilizing the change in resistance resulting from the change in the internal state, data is stored in non-volatile manner in the memory cell.

When data is to be written to an MRAM, it is necessary to cause current to flow bi-directionally, that is, in two directions, through the bit lines, as described above. Therefore, in a conventional MRAM, current drivers each including a charging P-channel MOS transistor and a discharging N-channel MOS transistor are arranged at opposite ends of each bit line, and a current is caused to flow from one current driver to the other current driver in accordance with the write data, to realize data writing to the memory cell.

Here, in order to attain the same current drivability in the P-channel and N-channel MOS transistors, the P-channel MOS transistor is generally becomes larger than the N-channel MOS transistor. Japanese Patent Laying-Open No. 2002-093144 discloses a current driver having a small area, including an N-channel MOS transistor and a current source connected in series with the transistor.

There has been a stronger demand for smaller size semiconductor memory devices, as portable electronic devices are increasing. In a semiconductor memory device in which data is written to a memory cell by causing currents to flow bi-directionally through the bit lines as in the case of an MRAM, generally, each bit line has current drivers arranged at opposite ends, and therefore, a large area is occupied by the current drivers. Therefore, in such a semiconductor memory device as represented by the MRAM, decrease in the area of current drivers has been desired.

Further, as smaller energy consumption has also been desired recently, not only the size but also the power consumption of the semiconductor device should be decreased. Power consumption is in proportion to the square of power supply voltage, and therefore, it is effective to lower the power supply voltage to decrease power consumption.

In the conventional MRAM described above, in a current path from a power supply on a higher potential side connected to a current driver at one end of a bit line to a power supply on a lower potential side connected to a current driver at the other end of the bit line, there are two MOS transistors inserted in series. Specifically, from the power source on the higher potential side connected to one current driver, a current for data writing flows to the bit line through the P-channel MOS transistor, and the current for data writing flows to the power supply on the lower potential side through the N-channel MOS transistor of the current driver connected to the other end of the bit line.

Therefore, in the conventional MRAM, the resistance of the entire current path increases because of the on-resistance of these two transistors, and therefore, the power supply potential must be relatively high, in order to cause a prescribed current for data writing to flow through the bit line. Thus, decrease of the power supply voltage has been limited in the conventional MRAM having current drivers of such a configuration, and as a result, it has been difficult to further reduce power consumption.

The current driver of the MRAM described in Japanese Patent Laying-Open No. 2002-093144 realizes a small area and contributes to reduction in device size. The current path, however, still has two MOS transistors (N-channel MOS transistors) inserted in series. Therefore, even by this current driver, the above-described problems cannot be solved.

SUMMARY OF THE INVENTION

The present invention was made to solve these problems, and its object is to provide a semiconductor memory device that realizes reduction in size, by decreasing the area occupied by current drivers.

Another object of the present invention is to provide a semiconductor memory device realizing reduction in power consumption of the device, by lowering the power supply voltage supplied to the current drivers.

The present invention provides a semiconductor memory device, including: a plurality of memory cells arranged in a matrix of rows and columns; a plurality of data write lines provided corresponding to the rows or columns of the plurality of memory cells; a plurality of current drivers receiving a voltage of a first power supply potential and a voltage of a second power supply potential lower than the first power supply potential, each connected to one end of the corresponding data write line; and a common line receiving a voltage of a third power supply potential lower than the first power supply potential and higher than the second power supply potential, and connected to the other end of each of the plurality of data write lines; wherein each of the plurality of current drivers includes a first transistor causing a current for data writing to flow through the corresponding data write line in a direction from the current driver to the common line, based on potential difference between the first power supply potential and the third power supply potential applied to the common line, when a write data is of a first logic level, and a second transistor causing the current for data writing to flow through the corresponding data write line in a direction from the common line to the current driver, based on potential difference between the third power supply potential applied to the common line and the second power supply potential, when the write data is of a second logic level complementary to the first logic level.

The present invention further provides a semiconductor memory device, including: a plurality of memory cells arranged in a matrix of rows and columns; a plurality of data write lines provided corresponding to the rows or columns of the plurality of memory cells; a plurality of current drivers receiving a voltage of a first power supply potential and a voltage of a second power supply potential lower than the first power supply potential, each connected to one end of the corresponding data write line; a common line connected to the other end of each of the plurality of data write lines; and a signal output circuit receiving the voltages of the first and second power supply potentials, and outputting a signal having a first logic level and a second logic level complementary to the first logic level, indicated by the first and second power supply potentials respectively, to the common line; wherein each of the plurality of current drivers includes a first transistor causing a current for data writing to flow through the corresponding data write line in a direction from the current driver to the common line, based on potential difference between the first power supply potential received by the current driver and the second power supply potential of the common line, when a write data has a first value and the signal is at the second logic level, and a second transistor causing the current for data writing to flow through the corresponding data write line in a direction from the common line to the current driver, based on potential difference between the first power supply potential of the common line and the second power supply potential received by the current driver, when the write data is of a second value complementary to the first value and the signal is at the first logic level.

Therefore, according to the present invention, the current driver is arranged on only one side of the data write line, and a common line to which a prescribed voltage is applied is connected to the other end of the data write line. Accordingly, the area occupied by the current drivers can be reduced, and a smaller semiconductor memory device can be provided.

Further, according to the present invention, only one driver transistor is inserted to the current path of the current for data writing. Therefore, the current path has a low resistance, and a lower power supply voltage may be used. Therefore, power consumption of the semiconductor memory device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
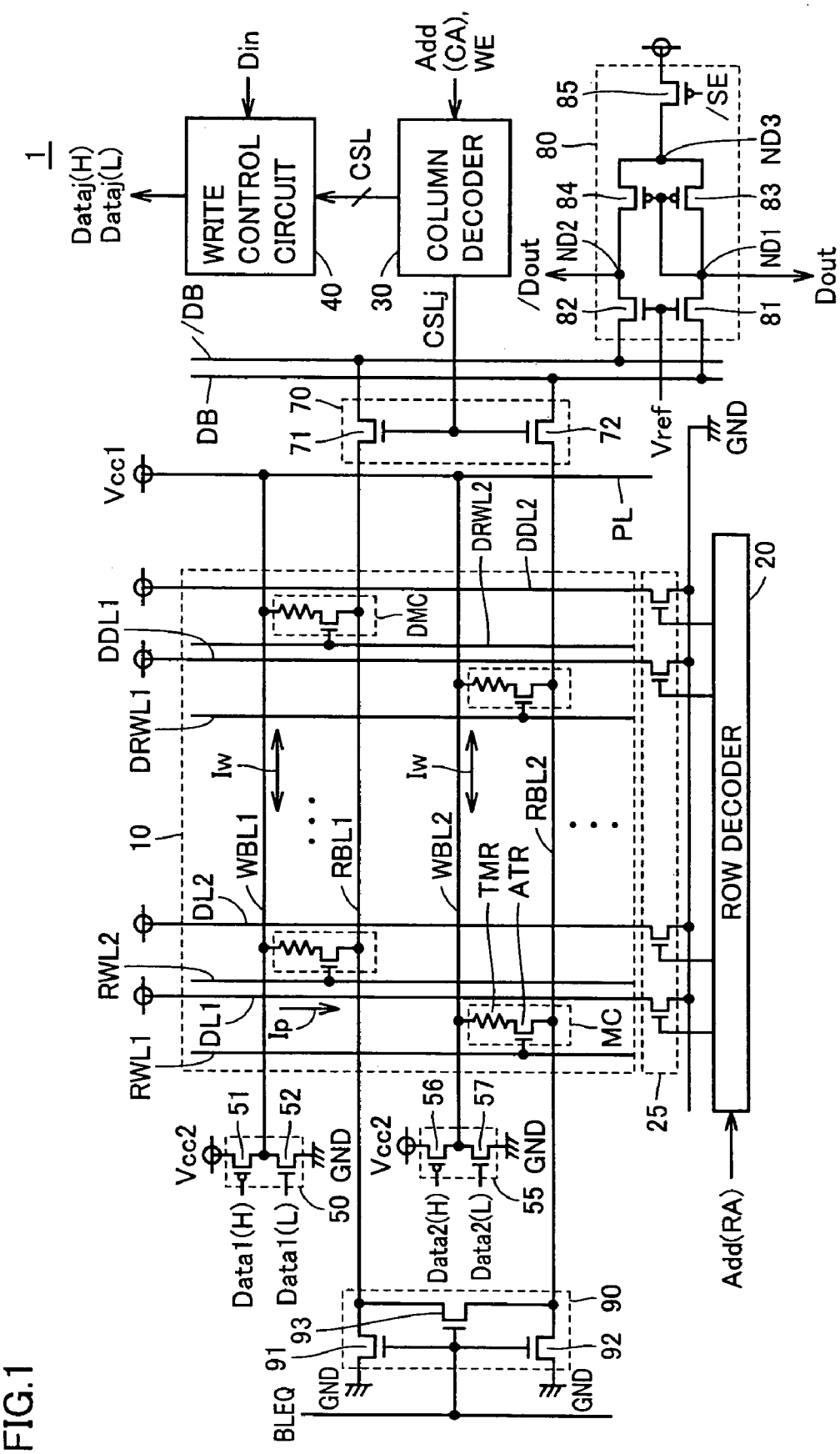
FIG. 1 is a circuit diagram representing an overall configuration of the MRAM in accordance with a first embodiment of the present invention.

Embodiments of the present invention will be described in detail in the following, with reference to the figures. Throughout the figures, the same or corresponding portions are denoted by the same reference characters, and description thereof will not be repeated.

[First Embodiment]

FIG. 1 is a circuit diagram representing an overall configuration of the MRAM in accordance with a first embodiment of the present invention.

Referring to FIG. 1, an MRAM 1 includes a memory array 10 including a plurality of MTJ memory cells MCs and a plurality of dummy MTJ memory cells DMCs arranged in a matrix of rows and columns, a row decoder 20, a digit line driver 25, a column decoder 30, a write control circuit 40, current drivers 50 and 55, a column selecting gate 70, a sense amplifier 80, and a precharge/equalize circuit 90.

The MRAM 1 further includes a plurality of read word lines RWL1, RWL2, . . . and a plurality of digit lines DL1, DL2, . . . provided corresponding to the rows of the memory cells, a plurality of dummy read word lines DRWL1, DRWL2, . . . and a plurality of dummy digit lines DDL1, DDL2, . . . also provided corresponding to the rows of the memory cells, a plurality of write bit lines WBL1, WBL2, . . . and a plurality of read bit lines RBL1, RBL2, . . . provided corresponding to the columns of the memory cells, a common line PL, and data buses DB and /DB.

Though only the first and second rows and first and second columns are shown in FIG. 1 for simplicity of description, it is understood that other rows and columns are arranged in a repeated manner, and current drivers and the like are provided correspondingly. In the following, description will be given with reference to the portions shown in FIG. 1.

Each of the MTJ memory cells MCs and dummy MTJ memory cells DMCs arranged in memory array 10 includes a tunnel magnetic resistance element TMR and an access transistor ATR, arranged in series between the corresponding write bit line WBLj (j is a natural number) and read bit line RBLj. The dummy MTJ memory cell DMC is for generating a reference current to be compared with a memory cell current Icell that flows through a selected memory cell at the time of data reading, and its configuration is the same as that of the MTJ memory cell MC. The configuration of the MTJ memory cell MC and the principle of data storage will be given in the following.

Figure 2:
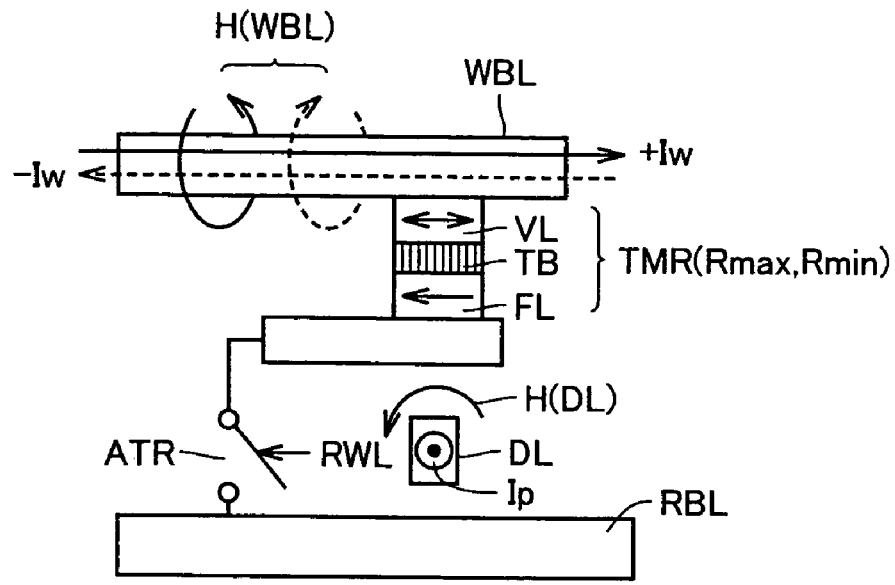
FIG. 2 illustrates a configuration of an MTJ memory cell and an operation of data writing to the MTJ memory cell.

FIG. 2 illustrates a configuration of an MTJ memory cell MC and an operation of data writing to the MTJ memory cell MC.

Referring to FIG. 2, the tunnel magnetic resistance element TMR has a ferromagnetic layer FL having a prescribed fixed direction of magnetization (hereinafter referred to as a "fixed magnetization layer"), and a ferromagnetic layer VL that is magnetized in a direction corresponding to an externally applied magnetic field (hereinafter referred to as a "free magnetization layer"). Between the fixed magnetization layer FL and the free magnetization layer VL, a tunnel barrier (tunnel film) TB of an insulating film is formed. The free magnetization layer VL is magnetized in a direction same as or opposite to (anti-parallel) that of the fixed magnetization layer FL corresponding to the value of the data to be written. The fixed magnetization layer FL, tunnel barrier TB and free magnetization layer VL form the magnetic tunnel junction.

Electric resistance of the tunnel magnetic resistance element TMR changes in accordance with the relative relation between the directions of magnetization of the fixed magnetization layer FL and the free magnetization layer VL. Specifically, the electric resistance of the tunnel magnetic resistance element TMR attains the minimum value Rmin when the direction of magnetization of the free magnetization layer VL is parallel to the direction of magnetization of the fixed magnetization layer FL, and attains the maximum value Rmax when the magnetization directions of the two layers are opposite to each other (anti-parallel).

At the time of data writing, the read word line RWL is inactivated, and the access transistor ATR is turned OFF. In this state, a current Iw for data writing in the direction corresponding to the logic level of the data to be written is caused to flow through the write bit line WBL, and a current Ip for data writing in a prescribed direction is caused to flow through the digit line DL. Then, a magnetic field corresponding to the direction of the current is generated in each of the write bit line WBL and the digit line DL, and a sum of these magnetic fields is applied to the free magnetization layer VL. By the generated magnetic fields, the free magnetization layer VL is magnetized in a direction parallel or anti-parallel (opposite) to that of the fixed magnetization layer FL, along the easy axis of magnetization that is along the direction of magnetization of the fixed magnetization layer FL.

In order to rewrite a data stored in the MTJ memory cell MC, that is, in order to change the direction of magnetization of the tunnel magnetic resistance element TMR, it is necessary to cause a current for data writing not lower than a prescribed level to flow through both the write bit line WBL and the digit line DL. The direction of magnetization once written in the tunnel magnetic resistance element TMR, that is, the data stored in the MTJ memory cell, is kept in a non-volatile manner until a new data is written.

Figure 3:
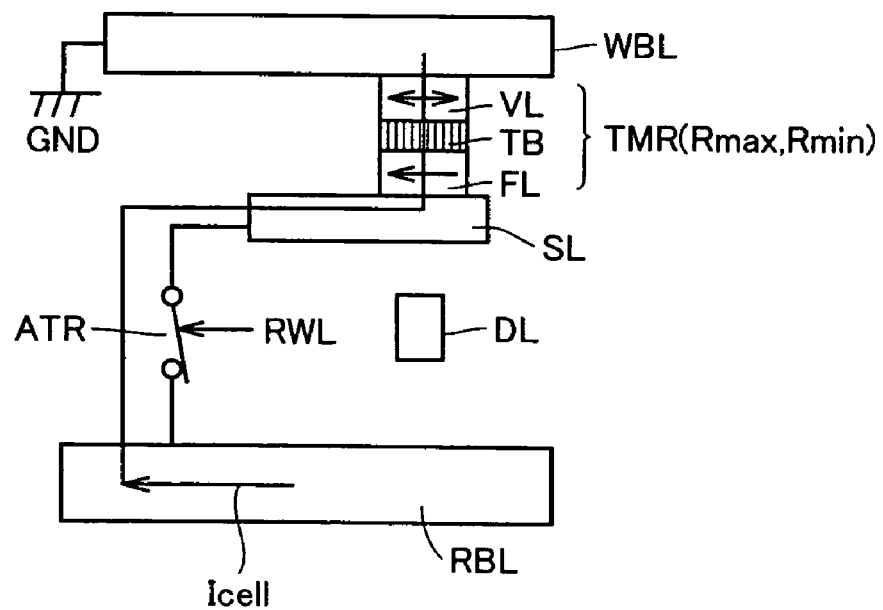
FIG. 3 illustrates an operation of data reading from the MTJ memory cell.

FIG. 3 illustrates an operation of data reading from the MTJ memory cell MC.

Referring to FIG. 3, at the time of data reading, the access transistor ATR is turned ON in response to activation of the read word line RWL. Further, the write bit line WBL is set to the ground voltage GND. Accordingly, the tunnel magnetic resistance element TMR is electrically coupled to the read bit line RBL, pulled down by the ground voltage GND.

In this state, when the read bit line RBL is pulled up with a prescribed voltage, a memory cell current Icell corresponding to the electric resistance of the tunnel magnetic resistance element TMR, that is, corresponding to the value of the data stored in the MTJ memory cell MC, passes through the current path including the read bit line RBL and the tunnel magnetic resistance element TMR. By a comparison between the memory cell current Icell with the prescribed reference current, the stored data is read from the MTJ memory cell MC.

The dummy MTJ memory cell is for generating the prescribed reference current, and a memory cell current Iref passing through the dummy MTJ memory cell DMC is used as the prescribed reference current.

As described above, the tunnel magnetic resistance element TMR has its electrical resistance changed in accordance with the direction of magnetization that can be rewritten by a data writing magnetic field applied thereto. Therefore, when the electric resistances Rmax and Rmin of the tunnel magnetic resistance element TMR are associated with the values ("1" and "0") of the stored data, the data can be stored in a non-volatile manner.

Again referring to FIG. 1, row decoder 20 generates a row selecting signal for each row of memory cells in accordance with a row address Add (RA), and outputs the generated row selecting signal to a digit line driver 25. In response to the row selecting signal received from row decoder 20, in digit line driver 25, a driver transistor of the selected row of memory cells (hereinafter also referred to as a "selected row") is turned ON. Consequently, the current Ip for data writing flows through the digit line DL of the selected row, in a direction from a power supply node to digit line driver 25.

Column decoder 30 generates a column selecting signal CSL for each column of memory cells in accordance with a column address signal Add (CA), and at the time of data writing, outputs the generated column selecting signal CSL to a write control circuit 40. In response to the column selecting signal CSL received from column decoder 30 and a write data Din, write control circuit 40 controls write control signals Dataj(H) and Dataj(L) ("j" is a natural number representing a "column") in each column of memory cells. Write control signals Dataj(H) and Dataj(L) are set to cause the current Iw for data writing to flow through the write bit line WBLj of the selected column of memory cells (hereinafter also referred to as a "selected column"), in the direction corresponding to the write data Din. Further, at the time of data reading, column decoder 30 outputs each generated column selecting signal CSLj to the corresponding column selecting gate 70.

Current driver 50 is provided at one end of write bit line WBL1 having the other end connected to a common line PL fixed at a power supply voltage Vcc1, and includes a P-channel MOS transistor 51 and an N-channel MOS transistor 52. P-channel MOS transistor 51 is connected between a power supply voltage Vcc2 and write bit line WBL1, and receives at its gate a write control signal Data1(H). N-channel MOS transistor 52 is connected between write bit line WBL1 and the ground GND, and receives at its gate a write control signal Data1(L).

Current driver 55 is provided at one end of write bit line WBL2 having the other end connected to a common line PL, and includes a P-channel MOS transistor 56 and an N-channel MOS transistor 57. P-channel MOS transistor 56 is connected between a power supply voltage Vcc2 and a write bit line WBL2, and receives at its gate a write control signal Data2(H). N-channel MOS transistor 57 is connected between write bit line WBL2 and the ground voltage GND, and receives at its gate a write control signal Data2(L).

Current driver 50 is capable of causing the current Iw for data writing to flow through write bit line WBL1 in both directions, based on the write control signals Data1(H) and Data1(L) received from write control circuit 40. Further, current driver 55 is capable of causing the current Iw for data writing to flow through write bit line WBL2 in both directions, based on the write control signals Data2(H) and Data2(L) received from write control circuit 40. Operations of current drivers 50 and 55 will be described in detail later, with reference to the data writing operation of MRAM 1.

Column selecting gate 70 includes N-channel MOS transistors 71 and 72. N-channel MOS transistor 71 is connected between read bit line RBL1 and data bus /DB, and receives at its gate the column selecting signal CSLj. N-channel MOS transistor 72 is connected between read bit line RBL2 and data bus DB, and receives at its gate the column selecting signal CSLj.

Sense amplifier 80 includes N-channel MOS transistors 81 and 82, and P-channel MOS transistors 83 to 85. N-channel MOS transistor 81 is connected between data bus DB and a node ND 1, and receives at its gate a reference voltage Vref. N-channel MOS transistor 82 is connected between data bus /DB and a node ND2, and receives at its gate the reference voltage Vref. P-channel MOS transistor 83 is connected between nodes ND1 and ND3, and has its gate connected to node ND1. P-channel MOS transistor 84 is connected between nodes ND2 and ND3, and has its gate connected to node ND1. P-channel MOS transistor 85 is connected between a power supply node and node ND3, and receives at its gate an inverted signal /SE of a sense amplifier activating signal.

Precharge/equalize circuit 90 includes N-channel MOS transistors 91 to 93. N-channel MOS transistor 91 is connected between read bit line RBL1 and the ground voltage GND, and receives at its gate a bit line equalize signal BLEQ. N-channel MOS transistor 92 is connected between read bit line RBL2 and the ground voltage GND, and receives at its gate the bit line equalize signal BLEQ. N-channel MOS transistor 93 is connected between read bit lines RBL1 and RBL2, and receives at its gate the bit line equalize signal BLEQ.

Operations of column selecting gate 70, sense amplifier 80 and precharge/equalize circuit 90 will be described later with reference to a data reading operation of the MRAM 1.

The data writing operation of the MRAM 1 will be described in the following.

Figure 4:
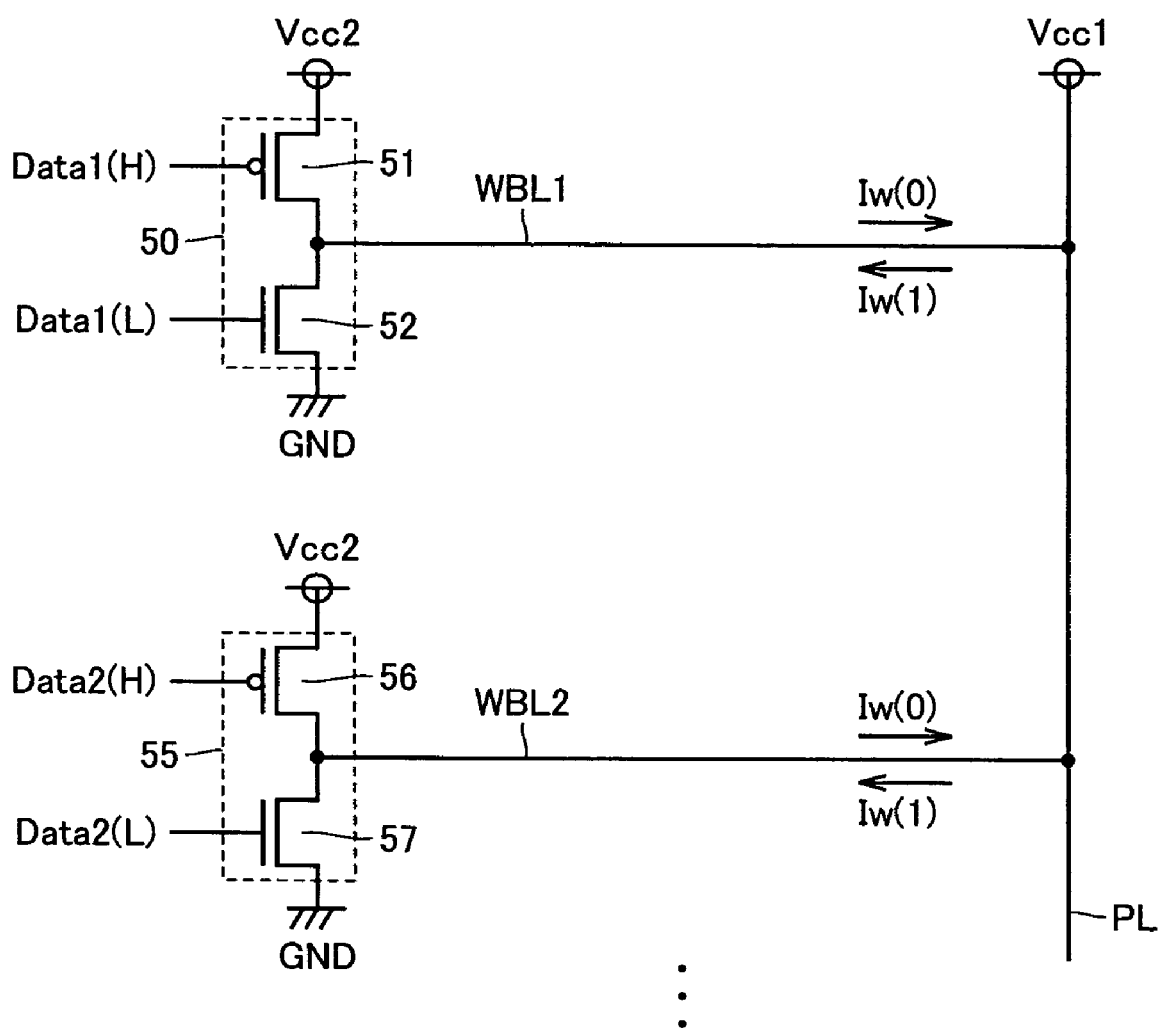
FIG. 4 is a circuit diagram extracting a portion related to the data write driver of the MRAM shown in FIG. 1.

FIG. 4 is a circuit diagram extracting a portion related to the data write driver of the MRAM shown in FIG. 1. In FIG. 4, similar to FIG. 1, only the write bit lines WBL1 and WBL2 of the first and second columns and corresponding portions are shown as representatives, and description will be given with reference to the portions shown in the figure.

Referring to FIG. 4, a main configuration of the data write driver of MRAM 1 in accordance with the first embodiment includes write bit lines WBL1 and WBL2, current drivers 50 and 55 connected respectively thereto, and common line PL connected to write bit lines WBL1 and WBL2. Common line PL receives power supply voltage Vcc1, and current drivers 50 and 55 receive power supply voltage Vcc2 and ground voltage GND. Here, power supply voltage Vcc1 is a power supply voltage of 1.2 V for a general logic circuit applied from the outside of MRAM 1, and power supply voltage Vcc2 is an I/O power supply voltage of 2.5 V that is also supplied from the outside. The ground voltage GND is also supplied from the outside.

Current drivers 50 and 55 are arranged at one end of corresponding write bit lines WBL1 and WBL2, respectively, which write bit lines WBL1 and WBL2 are both connected at the other end directly to common line PL. This configuration enables reduction in area occupied by the current drivers, as compared with the conventional MRAM in which current drivers have been arranged on both sides of the write bit lines.

As will be described later, because of the voltage difference between power supply voltages Vcc2 and Vcc1 or the voltage difference between power supply voltage Vcc1 and the ground voltage GND, a current for data writing flows through the write bit line. It is noted that the current flow path has only one driver transistor, and therefore, voltage drop caused by the driver transistor in the current path is small. Therefore, power supply voltages Vcc1 and Vcc2 may be lower voltages, and hence, power consumption of MRAM 1 can be reduced.

Figure 5:
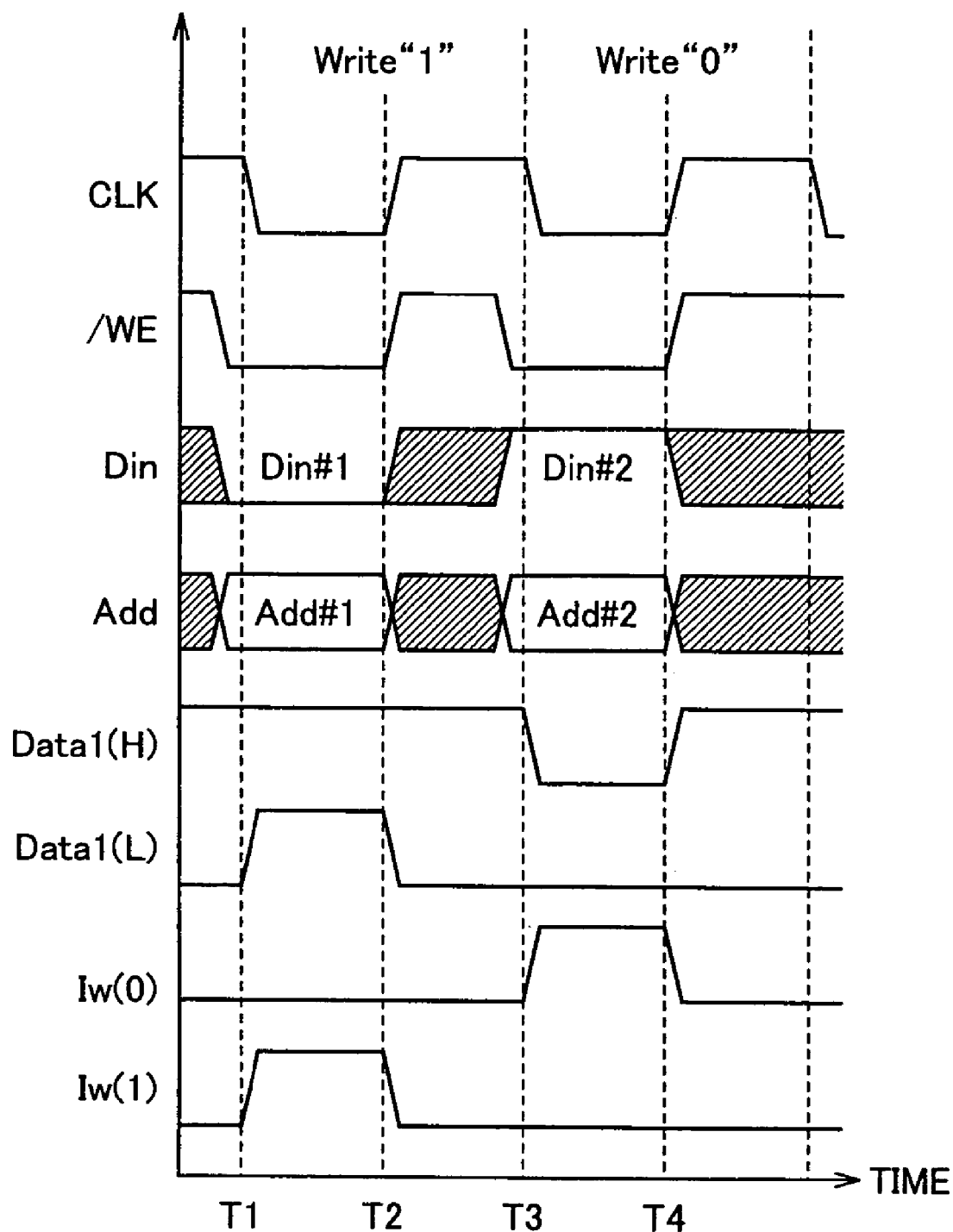
FIG. 5 is a diagram of waveforms representing a data writing operation of the MRAM in accordance with the first embodiment.

FIG. 5 is a diagram of waveforms representing a data writing operation of the MRAM 1 in accordance with the first embodiment.

Referring to FIG. 5 and FIGS. 1 and 4, MRAM 1 operates in synchronization with a clock signal CLK. Before time point T1, a write enable signal /WE input as a control signal form the outside of MRAM 1 attains to an L (logic low) level, and write data Din#1 (data "1") and an address Add#1 are input. In the figure, hatched portion represents that data is not specifically defined.

At time point T1, when the clock signal CLK falls, column decoder 30 outputs the column selecting signal CSL to write control circuit 40 in accordance with a column address Add#1 (CA). Upon reception of the column selecting signal CSL, write control circuit 40 outputs write control signals Data1(H) and Data1(L) both at an H (logic high) level based on the received column selecting signal CSL and the write data Din#1, and in response, P-channel MOS transistor 51 and N-channel MOS transistor 52 are turned OFF and ON, respectively. Then, because of the voltage difference between power supply voltage Vcc1 of 1.2 V of common line PL and the ground voltage GND received by current driver 50, the current Iw (1) for data writing flows through write bit line WBL1, in a direction from common line PL to current driver 50.

Meanwhile, row decoder 20 outputs a row selecting signal to digit line driver 25, based on a row address Add#1 (RA). Then, in digit line driver 25, a driver transistor connected to digit line DL2 turns ON in response to the row selecting signal, and the current Ip for data writing flows through digit line DL2. Consequently, in a MTJ memory cell MC as an object of data writing, connected to write bit line WBL1 and digit line DL2, data "1" is written in accordance with the direction of the current Iw(1) for data writing.

At time point T2, when the clock signal CLK rises, write enable signal /WE attains to the H level, and in response, write control signals Data1(H) and Data1(L) attain to the H level and L level, respectively. Therefore, P-channel MOS transistor 51 and N-channel MOS transistor 52 of current driver 50 are both turned OFF, and the current Iw (1) for data writing attains to 0.

Then, before the time point T3, write enable signal /WE again attains to the L level, and write data Din#2 (data "0") and address Add#2 are input.

At time point T3, when the clock signal CLK falls, column decoder 30 outputs the column selecting signal CSL to write control circuit 40 based on a column address Add#2 (CA). Upon reception of the column selecting signal CSL, write control signal 40 outputs write control signals Data1 (H) and Data1(L) both at the L level based on the received column selecting signal CSL and the write data Din#2, and in response, P-channel MOS transistor 51 and N-channel MOS transistor 52 are turned ON and OFF, respectively. Then, because of the voltage difference between power supply voltage Vcc2 of 2.5 V received by current driver 50 and power supply voltage Vcc1 of 1.2 V of common line PL, the current Iw(0) for data writing flows through write bit line WBL1 in a direction from current driver 50 to common line PL.

When digit line DL2 is selected and the current Ip for data writing flows through digit line DL2 in the similar manner as in the writing of data "1", in a MTJ memory cell MC as an object of data writing, connected to write bit line WBL1 and digit line DL2, data "0" is written in accordance with the direction of the current Iw(0) for data writing.

At time point T4, when the clock signal CLK rises, write enable signal /WE again attains to the H level, and in response, write control signals Data1(H) and Data1(L) attain to the H level and the L level, respectively. Therefore, P-channel MOS transistor 51 and N-channel MOS transistor 52 of current driver 50 are both turned OFF, and the current Iw (0) for data writing attains to 0.

It is noted that data is written to an MTJ memory cell MC connected to write bit line WBL2 in the similar manner.

A data reading operation of the MRAM 1 will be described in the following.

Again referring to FIG. 1, before the reading operation, bit line equalize signal BLEQ is set to the H level, and read bit lines RBL1 and RBL2 forming a bit line pair are precharged to the ground voltage GND by precharge/equalize circuit 90. In the-data reading operation, write bit lines WBL1 and WBL2 are set at the ground voltage GND.

Then, read word line RWL2 of the selected row is activated, and in order to select a dummy MTJ memory cell DMC connected to a read bit line RBL2 forming a bit line pair with the read bit line RBL1 to which the selected memory cell is connected, the dummy read word line DRWL1 to which the dummy MTJ memory cell DMC is connected is also activated.

Thereafter, when the column selecting signal CSLj of the selected column is set to the H level by column decoder 30, read bit lines RBL1 and RBL2 are electrically connected to data buses /DB and DB, respectively, by column selecting gate 70. Consequently, a data reading current is supplied to the selected memory cell and the dummy MTJ memory cell DMC from sense amplifier 80 connected to data buses /DB and DB, and voltages corresponding to the resistance values of the selected memory cell and the dummy MTJ memory cell DMC are generated on read bit lines RBL1 and RBL2, respectively. The voltage difference between read bit lines RBL1 and RBL2 is amplified by sense amplifier 80, and read data Dout and /Dout are output from sense amplifier 80.

As described above, in the MRAM 1 in accordance with the first embodiment, the current drivers are arranged on only one side of the write bit lines, and a common line PL, to which a prescribed voltage is applied, is connected to the other end of the write bit lines. Therefore, the area occupied by the current drivers can be reduced.

Further, in the MRAM 1, as only one driver transistor is inserted in the current path of the current for data writing, the current path has low resistance, and therefore, power supply voltages Vcc1 and Vcc2 may be lowered.

[First Modification of the First Embodiment]

In the first embodiment, current drivers 50 and 55 are arranged on the same side of corresponding write bit lines WBL1 and WBL2, respectively. In the first modification of the first embodiment, the current drivers are arranged alternately on left and right sides of write bit lines one by one.

Figure 6:
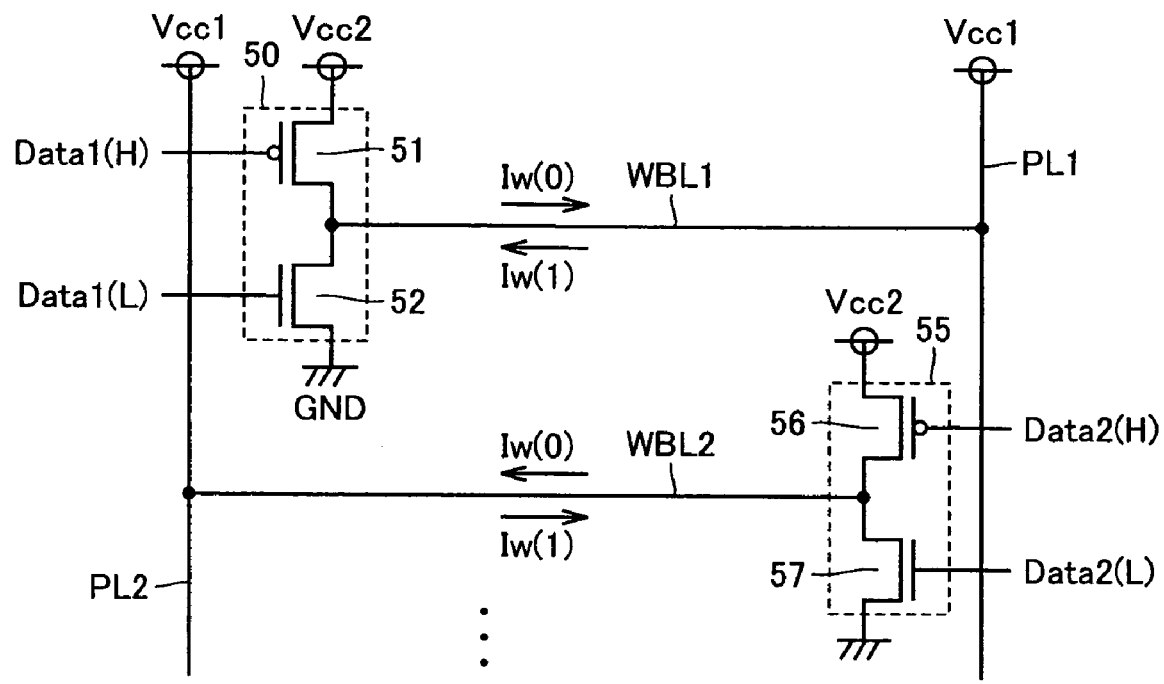
FIG. 6 is a circuit diagram representing a configuration of a data write driver of the MRAM in accordance with a first modification of the first embodiment.

FIG. 6 is a circuit diagram representing a configuration of a data write driver of the MRAM in accordance with the first modification of the first embodiment.

Referring to FIG. 6, in the data write driver of the MRAM in accordance with the first modification, common lines PL1 and PL2, to which power supply voltage Vcc1 is applied, are arranged on opposite sides of write bit lines WBL1, WBL2, . . . Write bit line WBL1 has one end connected to common line PL1, and the other end connected to current driver 50. On the other hand, write bit line WBL2 next to write bit line WBL1 has one end connected to common line PL2 and the other end connected to current driver 55.

In this manner, as the current drivers are arranged alternately on left and right sides for every write bit line, it becomes possible to arrange the current drivers according to fine layout pitch of the write bit lines, and therefore, the MRAM can further be reduced in size.

[Second Modification of the First Embodiment]

In the first embodiment, the power supply voltages Vcc1, Vcc2 and the ground voltage GND are all supplied from the outside, and it is desired that power supply voltage Vcc1 is intermediate between the power supply voltage Vcc2 and the ground voltage. In the second modification of the first embodiment, power supply voltage Vcc2 and the ground voltage GND are supplied from the outside, while power supply voltage Vcc1 is generated by an internal voltage down-converter circuit provided in the MRAM.

Figure 7:
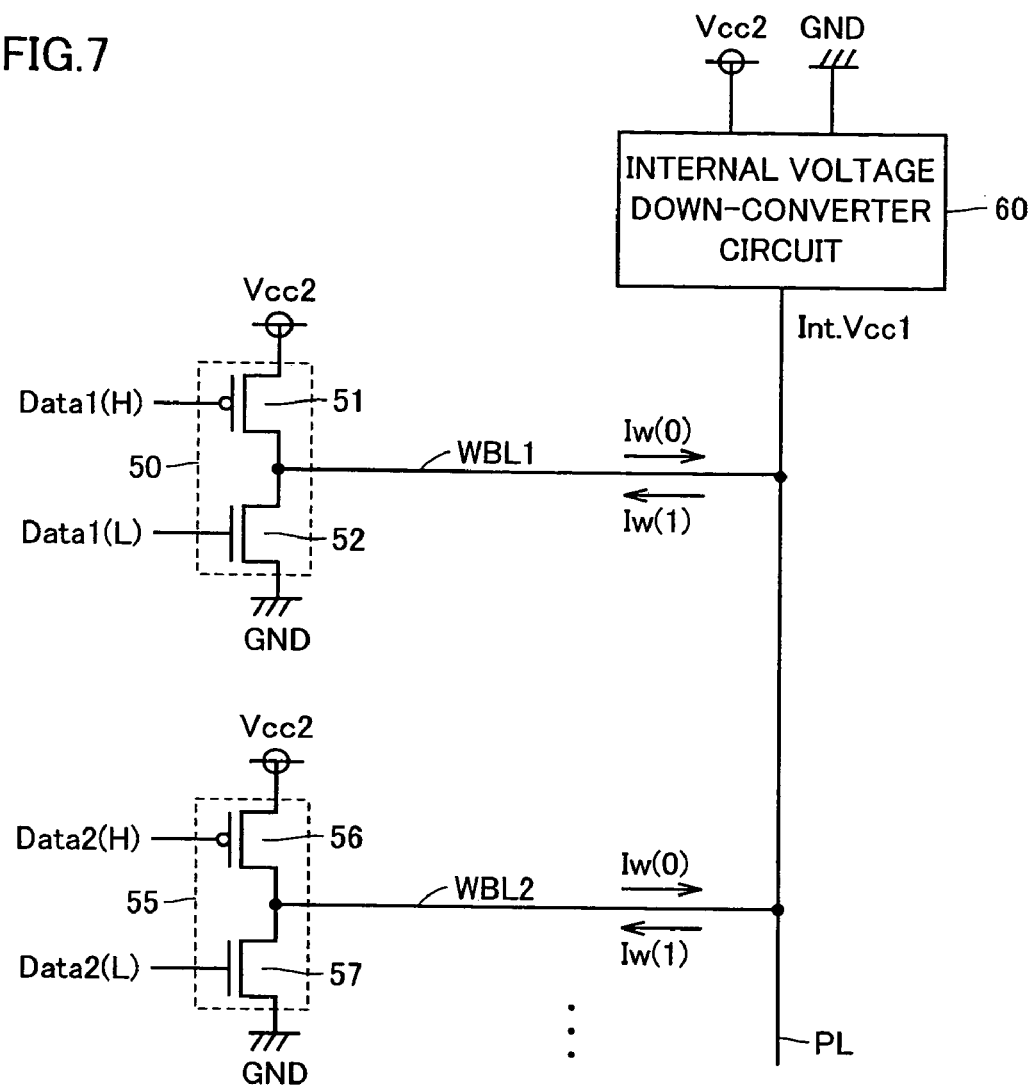
FIG. 7 is a circuit diagram representing a configuration of a data write driver of the MRAM in accordance with a second modification of the first embodiment.

FIG. 7 is a circuit diagram representing a configuration of a data write driver of the MRAM in accordance with the second modification of the first embodiment.

Referring to FIG. 7, the data write driver of the MRAM has the configuration of the data write driver in accordance with the first embodiment shown in FIG. 4 and, in addition, includes an internal voltage down-converter circuit 60 connected to the common line PL.

Internal voltage down-converter circuit 60 receives power supply voltage Vcc2 and the ground voltage GND from the outside, generates an internal power supply voltage Int.Vcc1, and outputs the voltage to common line PL. Here, it is desired that the internal power supply voltage Int.Vcc1 is intermediate between power supply voltage Vcc2 and the ground voltage GND received from the outside. In this example, as compared with the power supply voltage Vcc2 of 2.5 V, internal voltage down-converter circuit 60 generates internal power supply voltage Int.Vcc1 of 1.2 V.

Other configuration of the data write driver of the MRAM is the same as that of the data write driver shown in FIG. 4, and therefore, description thereof will not be repeated.

Figure 8:
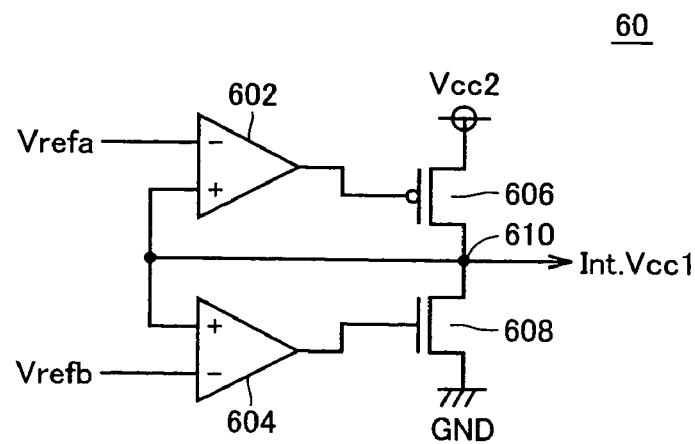
FIG. 8 is a circuit diagram representing a configuration of an internal voltage down-converter circuit shown in FIG. 7.

FIG. 8 is a circuit diagram representing a configuration of internal voltage down-converter circuit 60 shown in FIG. 7.

Referring to FIG. 8, internal voltage down-converter circuit 60 includes comparators 602 and 604, a P-channel MOS transistor 606, and an N-channel MOS transistor 608. Comparator 602 compares internal power supply voltage Int.Vcc1 as the voltage of node 610, that is, an output voltage, with a first reference voltage Vrefa, and when the internal power supply voltage Int.Vcc1 is lower than the first reference voltage Vrefa, outputs an L-level signal. Comparator 604 compares the internal power supply voltage Int.Vcc1 as the output voltage with a second reference voltage Vrefb, and when the internal power supply voltage Int.Vcc1 is higher than the second reference voltage Vrefb, outputs an H-level signal.

Here, the first and second reference voltages Vrefa and Vrefb are set to (1.2V−α) and (1.2V+α), respectively. Here, α is set to be an appropriate small value to prevent chattering.

P-channel MOS transistor 606 is connected between power supply voltage Vcc2 and node 610, and receives at its gate an output signal from comparator 602. N-channel MOS transistor 608 is connected between node 610 and ground voltage GND, and receives at its gate an output signal from comparator 604.

In internal voltage down-converter circuit 60, when the internal power supply voltage Int.Vcc1 becomes lower than the first reference voltage Vrefa, the output of comparator 602 attains to the L level, and P-channel MOS transistor 606 is turned ON, so that the internal power supply voltage Int.Vcc1 increases. When the internal power supply voltage Int.Vcc1 becomes higher than the second reference voltage Vrefb, the output of comparator 604 attains to the H level, and N-channel MOS transistor 608 turns ON, so that the internal power supply voltage Int.Vcc1 decreases. In this manner, internal voltage down-converter circuit 60 lowers the power supply voltage Vcc2 and generates a constant internal power supply voltage Int.Vcc1.

As described above, according to the second modification, similar effects as in the first embodiment can be attained, and further, only one external power supply is required.

[Third Modification of the First Embodiment]

In the first embodiment, the read bit line RBL is separated from the write bit line WBL, while in the third modification of the first embodiment, these bit lines are common.

Figure 9:
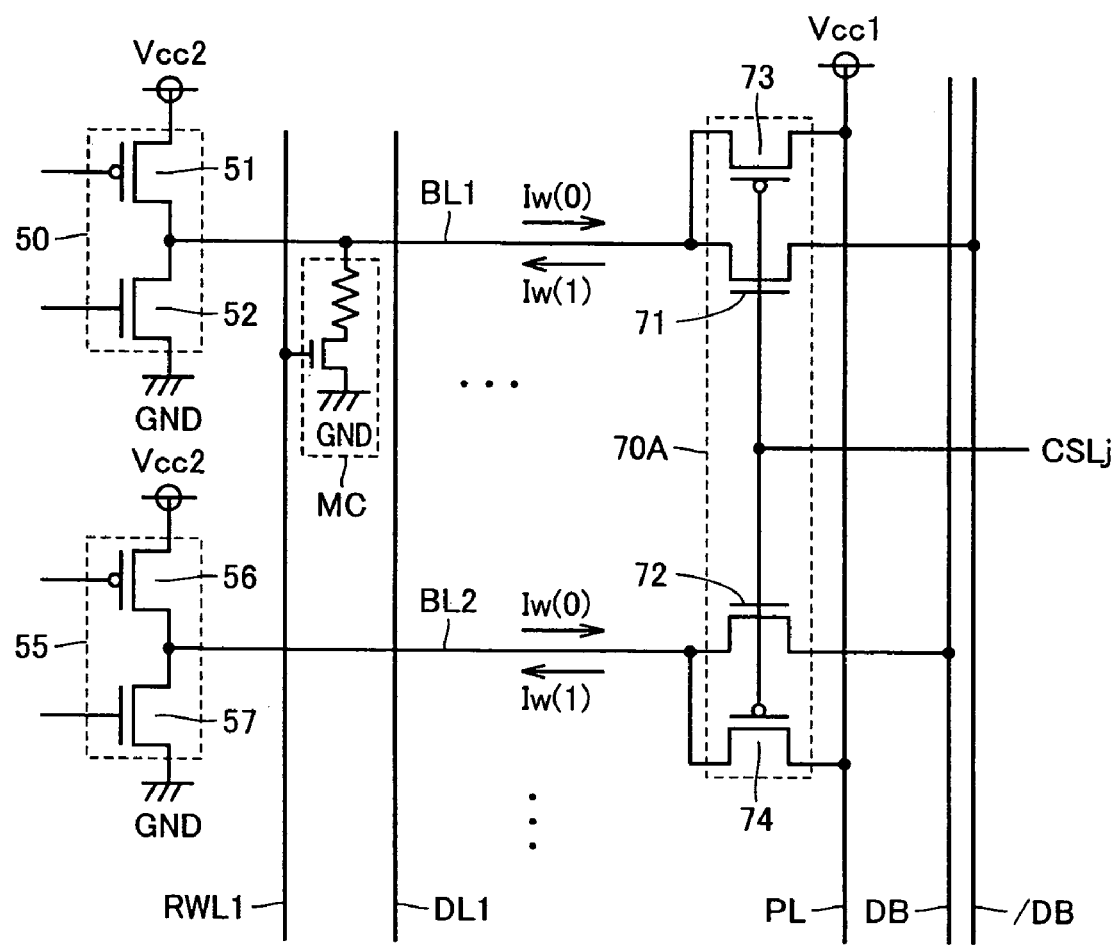
FIG. 9 is a circuit diagram representing a configuration of a data write driver of the MRAM in accordance with a third modification of the first embodiment.

FIG. 9 is a circuit diagram representing a configuration of a data write driver of the MRAM in accordance with a third modification of the first embodiment.

Referring to FIG. 9, bit lines BL1 and BL2 are used both for data writing and data reading. Sources of access transistors ATR of the MTJ memory cell MC and of the dummy MTJ memory cell DMC, which is not shown, that have been connected to the read bit line in the first embodiment are grounded. Current drivers 50 and 55 are connected to one end of bit lines BL1 and BL2, respectively, and a column selecting gate 70A is connected to the other end of bit lines BL1 and BL2.

Column selecting gate 70A includes N-channel MOS transistors 71 and 72, and P-channel MOS transistors 73 and 74. N-channel MOS transistor 71 is connected between bit line BL1 and data bus /DB, and receives at its gate a column selecting signal CSLj. N-channel MOS transistor 72 is connected between bit line BL2 and data bus DB, and receives at its gate a column selecting signal CSLj. P-channel MOS transistor 73 is connected between bit line BL1 and common line PL, and receives at its gate a column selecting signal CSLj. P-channel MOS transistor 74 is connected between bit line BL2 and common line PL, and receives at its gate a column selecting signal CSLj.

Column selecting gate 70A electrically connects the bit lines BL1 and BL2 to common line PL when column selecting signal CSLj is at the L level, that is, any time other than at the time of data reading, including the time of data writing. Therefore, at the time of data writing, bit lines BL1 and BL2 function as write bit lines.

When the column selecting signal CSLj is at the H level, that is, at the time of data reading, column selecting gate 70A electrically separates bit lines BL1 and BL2 from common line PL, and electrically connects the bit lines to data buses /DB and DB, respectively. Therefore, at the time of data reading, bit lines BL1 and BL2 function as read bit lines.

In this manner, in the third modification also, the current drivers are arranged on only one side of the bit lines, and therefore, the area occupied by the current drivers can be reduced.

[Fourth Modification of the First Embodiment]

In the first embodiment and the first and second modifications thereof, the current Iw for data writing that corresponds to the write data is caused to flow through the write bit line WBL. In the fourth modification of the first embodiment, the current Iw for data writing that corresponds to the write data is caused to flow through the digit line DL.

Figure 10:
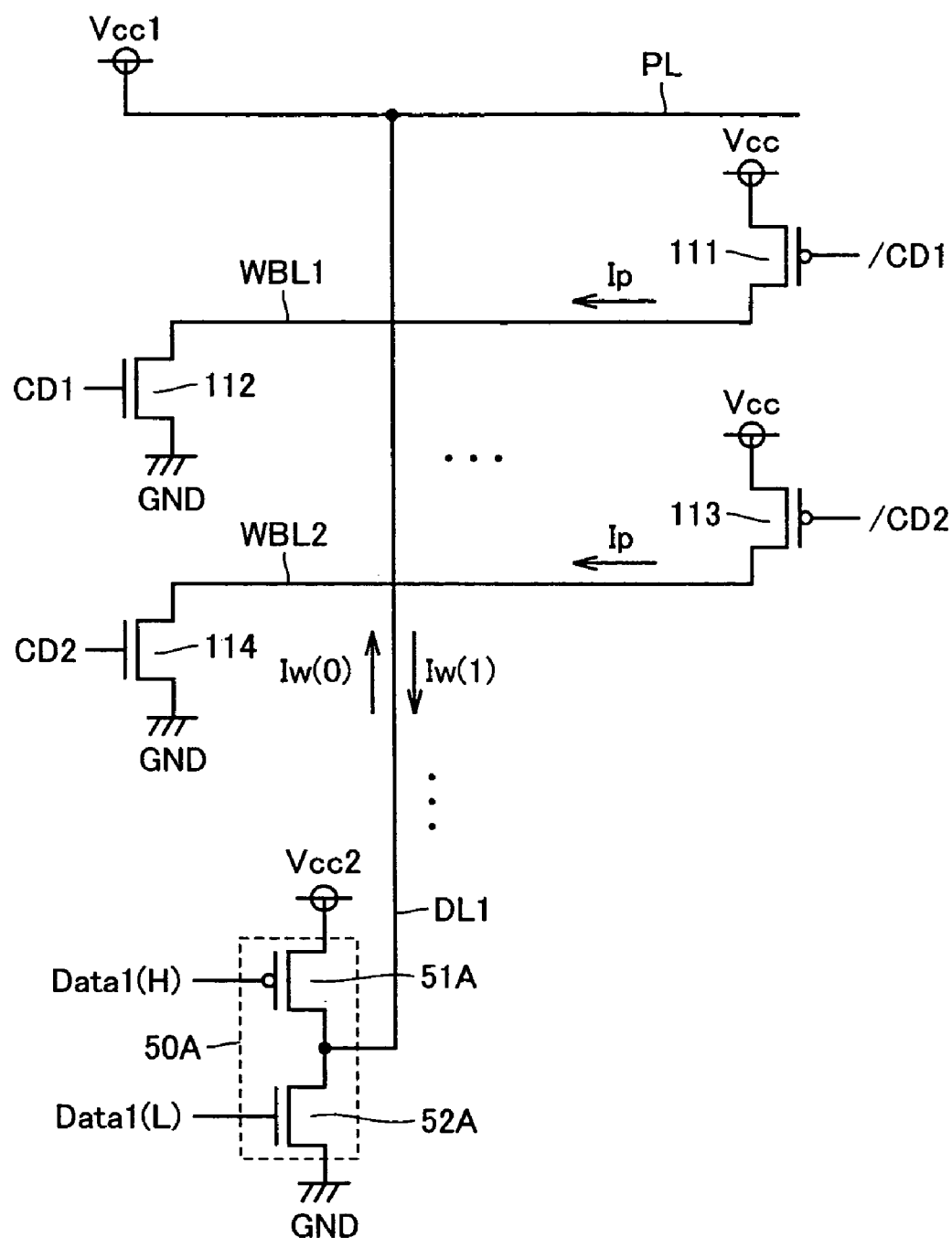
FIG. 10 is a circuit diagram representing a configuration of a data write driver of the MRAM in accordance with a fourth modification of the first embodiment.

FIG. 10 is a circuit diagram representing a configuration of a data write driver of the MRAM in accordance with the fourth modification of the first embodiment. In FIG. 10, only the write bit lines WBL1 and WBL2 of the first and second columns, the digit line DL1 of the first row, and corresponding portions are shown as representatives, and description will be given with reference to the portions shown in the figure.

Referring to FIG. 10, the data write driver of the MRAM in accordance with the fourth modification includes a current driver 50A at one end of digit line DL1, and the other end of digit line DL1 is directly connected to common line PL arranged parallel to write bit lines WBL1 and WBL2 and receiving power supply voltage Vcc1 applied thereto. Current driver 50A includes a P-channel MOS transistor 51A connected between power supply voltage Vcc2 and digit line DL1 and receiving at its gate a write control signal Data1 (H), and an N-channel MOS transistor 52A connected between digit line DL1 and the ground voltage GND and receiving at its gate a control signal Data1(L).

At opposite ends of write bit line WBL1, a P-channel MOS transistor 111 and an N-channel MOS transistor 112 are provided, and at opposite ends of write bit line WBL2, a P-channel MOS transistor 113 and an N-channel MOS transistor 114 are provided. P-channel MOS transistor 111 and N-channel MOS transistor 112 are turned ON when column selecting signal CD1 is at the H level, and at that time, causes a current Ip for data writing to flow in one direction, through write bit line WBL1. P-channel MOS transistor 113 and N-channel MOS transistor 114 are turned ON when the column selecting signal CD2 is at the H level, and at that time, causes the current Ip for data writing to flow in one direction, through write bit line WBL2.

In the fourth modification of the first embodiment, based on the voltage difference between the power supply voltage Vcc2 received by current driver 50A and the power supply voltage Vcc1 of common line PL, or voltage difference between the power supply voltage Vcc1 of common line PL and the ground voltage GND received by current driver 50A, current driver 50A causes the current Iw for data writing to flow through digit line DL1 in a direction determined by the write data.

In each of write bit lines WBL1 and WBL2, the current Ip for data writing is caused to flow in one direction, by the P-channel and N-channel MOS transistors provided at opposite ends.

When the current Iw for data writing in a direction determined by the write data flows through digit line DL1, and write bit line WBL1 is selected and the current Ip for data writing flows through write bit line WBL1, the write data corresponding to the direction of the current Iw for data writing is written to the MTJ memory cell MC that is connected to digit line DL1 and write bit line WBL1.

The data reading operation is performed in the similar manner as in the first embodiment.

In the fourth modification, as the current driver having the same configuration as current driver 50A is provided for every digit line, the circuit area increases at these portions as compared with the conventional MRAM. The configuration of the current drivers for the write bit lines, however, can be made simpler. Therefore, when the current drivers for the digit lines and the write bit lines are viewed as a whole, the area occupied by the current drivers can be reduced.

[Fifth Modification of the First Embodiment]

In the fifth modification of the first embodiment, as in the fourth modification, the current Iw for data writing corresponding to the write data is caused to flow through the digit line DL. Different from the fourth modification, however, the bit lines are used both for data writing and data reading.

Figure 11:
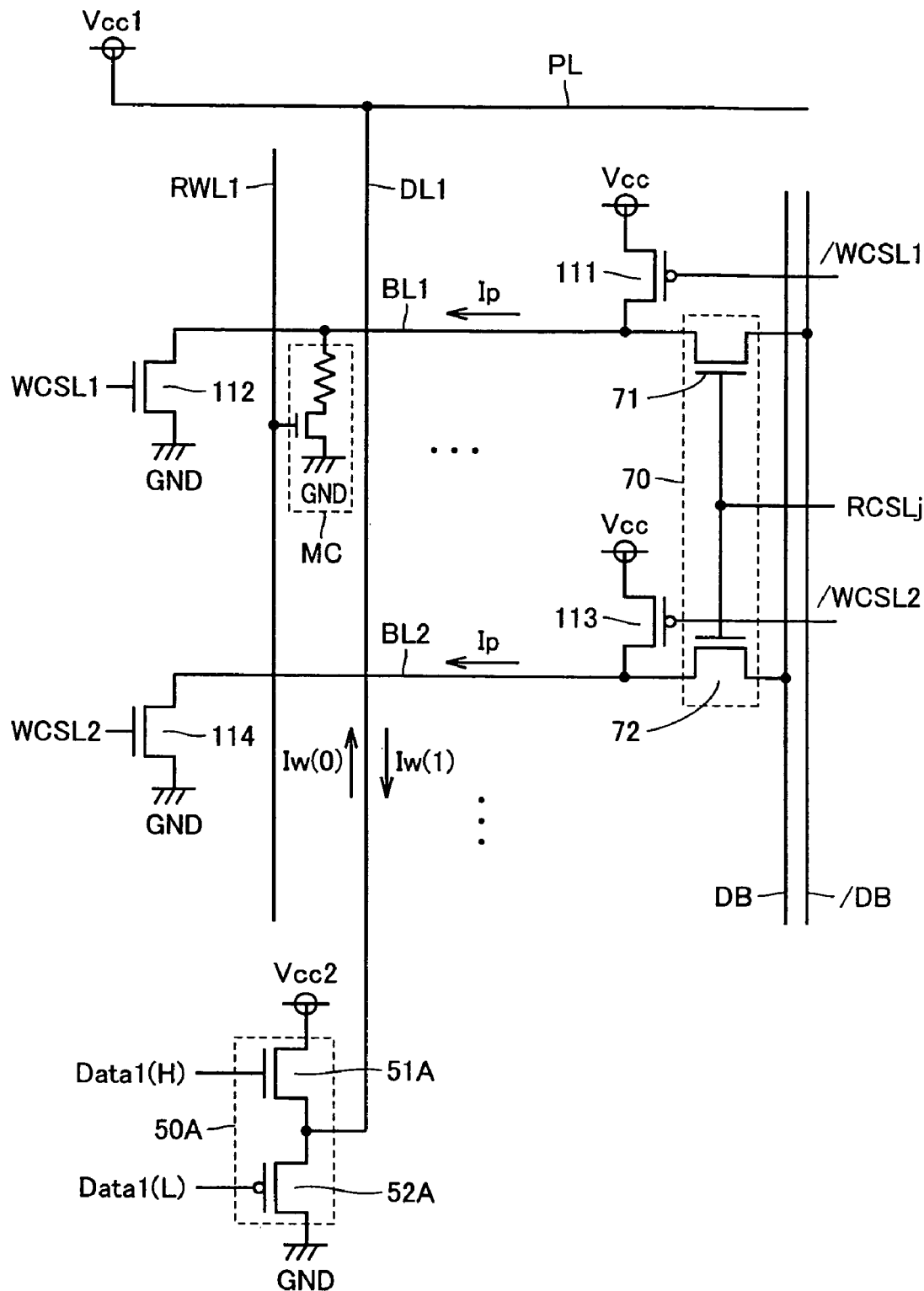
FIG. 11 is a circuit diagram representing a configuration of a data write driver of the MRAM in accordance with a fifth modification of the first embodiment.

FIG. 11 is a circuit diagram representing a configuration of a data write driver of the MRAM in accordance with the fifth modification of the first embodiment. In FIG. 11, only the bit lines BL1 and BL2 of the first and second columns, the digit line DL1 of the first row, and corresponding portions are shown as representatives, and description will be given with reference to the portions shown in the figure.

Referring to FIG. 11, the data write driver of the MRAM in accordance with the fifth modification includes current driver 50A at one end of digit line DL1, and the other end of digit line DL1 is directly connected to common line PL to which the power supply voltage Vcc1 is applied. Bit lines BL1 and BL2 are used both for data writing and data reading, and sources of access transistors ATR of the MTJ memory cell MC and dummy MTJ memory cell DMC, which is not shown, are grounded.

At opposite ends of bit line BL1, P-channel MOS transistor 111 and N-channel MOS transistor 112 are provided, respectively, and at opposite ends of bit line BL2, P-channel MOS transistor 113 and N-channel MOS transistor 114 are provided, respectively. Further, bit lines BL1 and BL2 are connected, at one end, to column selecting gate 70. When a read column selecting signal RCSLj is at the H level, that is, at the time of data reading, column selecting gate 70 electrically connects bit lines BL1 and BL2 to data buses /DB and DB, respectively. When the read column selecting signal RCSLj is at the L level, that is, any time other than the data reading, including the time of data writing, column selecting gate 70 electrically separates bit lines BL1 and BL2 from data buses /DB and DB.

In the fifth modification of the first embodiment, as in the fourth modification described above, at the time of data writing, based on the voltage difference between the power supply voltage Vcc2 received by current driver 50A and the power supply voltage Vcc1 of common line PL, or the voltage difference between the power supply voltage Vcc1 of common line PL and the ground voltage GND received by current driver 50A, the current Iw for data writing is caused to flow by current driver 50A through digit line DL1, in a direction determined by the write data.

Further, a write column selecting signal WCSL1 corresponding to bit line BL1, to which the MTJ memory cell MC as an object of data writing is connected, attains to the H level, and a read column selecting signal RCSLj attains to the L level. Therefore, the current Ip for data writing is caused to flow through bit line BL1, by P-channel and N-channel transistors 111 and 112 provided at opposite ends thereof.

The write data corresponding to the direction of the current Iw for data writing is written to the MTJ memory cell MC that is positioned at the intersection of digit line DL1 to which the current Iw for data writing is caused to flow and the bit line BL1 to which the current Ip for data writing is caused to flow.

At the time of data reading, write column selecting signals WCSL1 and WCSL2 both attain to the L level, and the read column selecting signal RCSLj attains to the H level. Therefore, the current Ip for data writing does not flow through bit lines BL1 and BL2, and by column selecting gate 70, bit lines BL1 and BL2 are electrically connected to data buses /DB and DB, respectively. Specifically, bit lines BL1 and BL2 function as read bit lines. Except for this point, the data reading operation is performed in the similar manner as in the first embodiment.

As described above, by the fifth modification also, the same effects as the fourth modification can be attained.

[Second Embodiment]

Though a voltage is always applied to common line PL in the first embodiment, in the second embodiment, a prescribed voltage is applied to common line PL only when the current driver is active.

Figure 12:
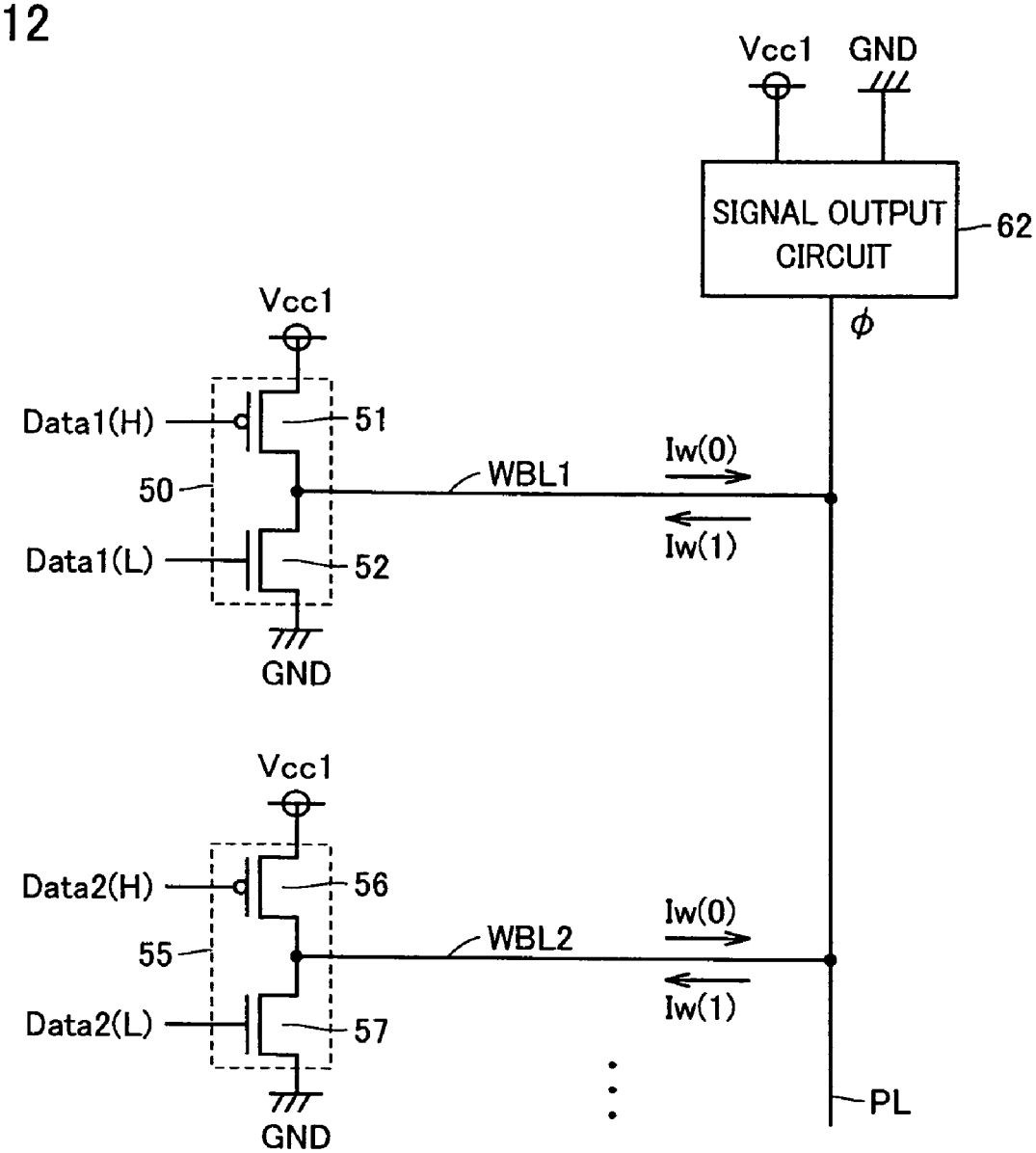
FIG. 12 is a circuit diagram representing a configuration of a data write driver of the MRAM in accordance with a second embodiment.

FIG. 12 is a circuit diagram representing a configuration of a data write driver of the MRAM in accordance with the second embodiment.

Referring to FIG. 12, the data write driver of the MRAM has the configuration of data write driver in accordance with the first embodiment of FIG. 4, and additionally includes a signal output circuit 62 connected to common line PL. Further, to current drivers 50 and 55, not the power supply voltage Vcc2 but the power supply voltage Vcc1 is supplied.

Signal output circuit 62 receives the power supply voltage Vcc1 and the ground voltage GND, and generates and outputs to common line PL a φ signal. Here, the φ signal is at the L level represented by the ground voltage GND in the former half and at the H level represented by the power supply voltage Vcc1 in the latter half, of the active period of the current driver.

Except this point, the configuration of the data write driver of the MRAM is the same as that of the data write driver in accordance with the first embodiment shown in FIG. 4.

In the data write driver, when the φ signal attains to the L level while P-channel MOS transistor 51 and N-channel MOS transistor 52 of current driver 50 are ON and OFF, respectively, current deriver 50 causes a current Iw (0) for data writing to flow through write bit line WBL1 in a direction from current driver 50 to common line PL, based on the voltage difference between the power supply voltage Vcc1 applied thereto and the ground voltage GND of common line PL.

When the φ signal attains to the H level while P-channel MOS transistor 51 and N-channel MOS transistor 52 of current driver 50 are OFF and ON, respectively, current deriver 50 causes a current Iw (1) for data writing to flow through write bit line WBL1 in a direction from common line PL to current driver 50, based on the voltage difference between the power supply voltage Vcc1 of common line PL and the ground voltage GND received by current driver 50.

When the φ signal is at the H level while P-channel and N-channel MOS transistors 51 and 52 are ON and OFF, respectively, or when the φ signal is at the L level while P-channel and N-channel MOS transistors 51 and 52 are OFF and ON, respectively, there is no voltage difference between opposite ends of write bit line WBL1, and therefore, no current for data writing flows through write bit line WBL1.

It is possible for current driver 55 to cause a current for data writing to flow through write bit line WBL2, in the similar manner. As the description of current driver 55 would be repetitive, the description will not be given here.

As described above, in the data write driver, the power supply voltage Vcc2 is unnecessary, and other than the ground voltage, only a low power supply voltage Vcc1 must be supplied from the outside.

Figure 13:
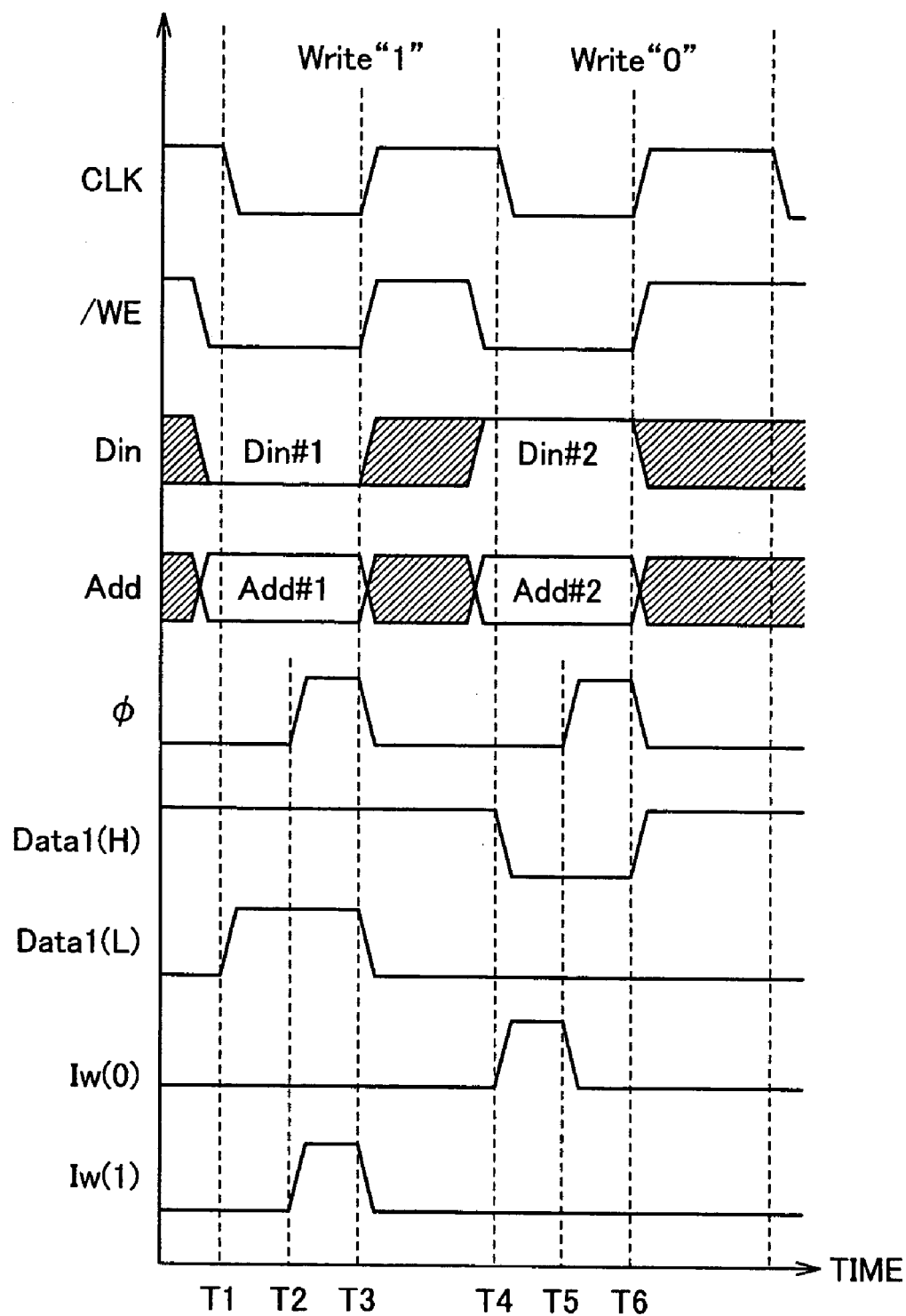
FIG. 13 is a diagram of waveforms representing an operation of the data write driver shown in FIG. 12.

FIG. 13 is a diagram of waveforms representing an operation of the data write driver shown in FIG. 12. In FIG. 13 also, as in FIG. 5 representing the operation of the data write driver in accordance with the first embodiment, description will be given with respect to an example in which the write data Din#1, that is, data "1" is written to the selected memory cell connected to write bit line WBL1 from T1 to T3, and the write data Din#2, that is, data "0" is written to the selected memory cell connected to write bit line WBL1 from T4 to T6.

Referring to FIG. 13, at time point T1, when the clock signal CLK falls, write control circuit 40 outputs write control signals Data1(H) and Data1(L) both at the H level, based on the column selecting signal CSL and the write data Din#1. In response, P-channel MOS transistor 51 and N-channel MOS transistor 52 are turned OFF and ON, respectively.

Further, signal output circuit 62 outputs the φ signal at the L level (ground voltage GND). At this time, opposite ends of write bit line WBL1 are both at the ground voltage GND, and the current for data writing does not flow through write bit line WBL1.

At time point T2, when signal output circuit 62 sets the φ signal to the H level, the current Iw (1) for data writing is caused to flow through write bit line WBL1 in the direction from common line PL to current driver 50, based on the potential difference between the power supply voltage Vcc1 of common line PL and the ground voltage GND received by current driver 50.

At time point T3, when the clock signal CLK rises, write control signals Data1(H) and Data1(L) attain to the H level and L level, respectively. Therefore, P-channel MOS transistor 51 and N-channel MOS transistor 52 of current driver 50 are both turned OFF, and the current Iw (1) for data writing attains to 0.

At time point T4, when the clock signal CLK falls again, write control circuit 40 outputs write control signals Data1 (H) and Data1(L) both at the L level based on the column selecting signal CSL and write data Din#2. In response, P-channel and N-channel MOS transistors 51 and 52 turn ON and OFF, respectively.

Meanwhile, signal output circuit 62 outputs the φ signal at the L level (ground voltage GND). Therefore, the current Iw (0) for data writing flows through write bit line WBL1 in a direction from current driver 50 to common line PL, based on the potential difference between the power supply voltage Vcc1 received by current driver 50 and the ground voltage GND of common line PL.

At time point T5, when signal output circuit 62 sets the φ signal to the H level, opposite ends of write bit line WBL1 both attain to the power supply voltage Vcc1, and the current Iw (0) for data writing through write bit line WBL1 attains to 0.

At time point T6, when the clock signal CLK rises, write control signals Data1(H) and Data1(L) attain to the H level and L level, respectively, and P-channel and N-channel MOS transistors 51 and 52 of current driver 50 both turn OFF.

As described above, from T1 to T3 and T4 to T6 when the current Iw (0) or Iw (1) for data writing is caused to flow through write bit line WBL1 and current driver 50 is active, if the current Ip for data writing is caused to flow through digit line DL corresponding to the selected memory cell, the data corresponding to the current Iw (0) or Iw (1) for data writing is written to the selected memory cell.

Though not specifically shown, in the second embodiment also, modifications similar to the first and third to fifth modifications of the first embodiment can be made.

As described above, effects comparable to those of the first embodiment can be attained by the MRAM in accordance with the second embodiment. Further, the MRAM requires only one external power supply, and the external power supply can be lowered.

[Third Embodiment]

In the third embodiment, common line PL is shared by adjacent memory blocks

Figure 14:
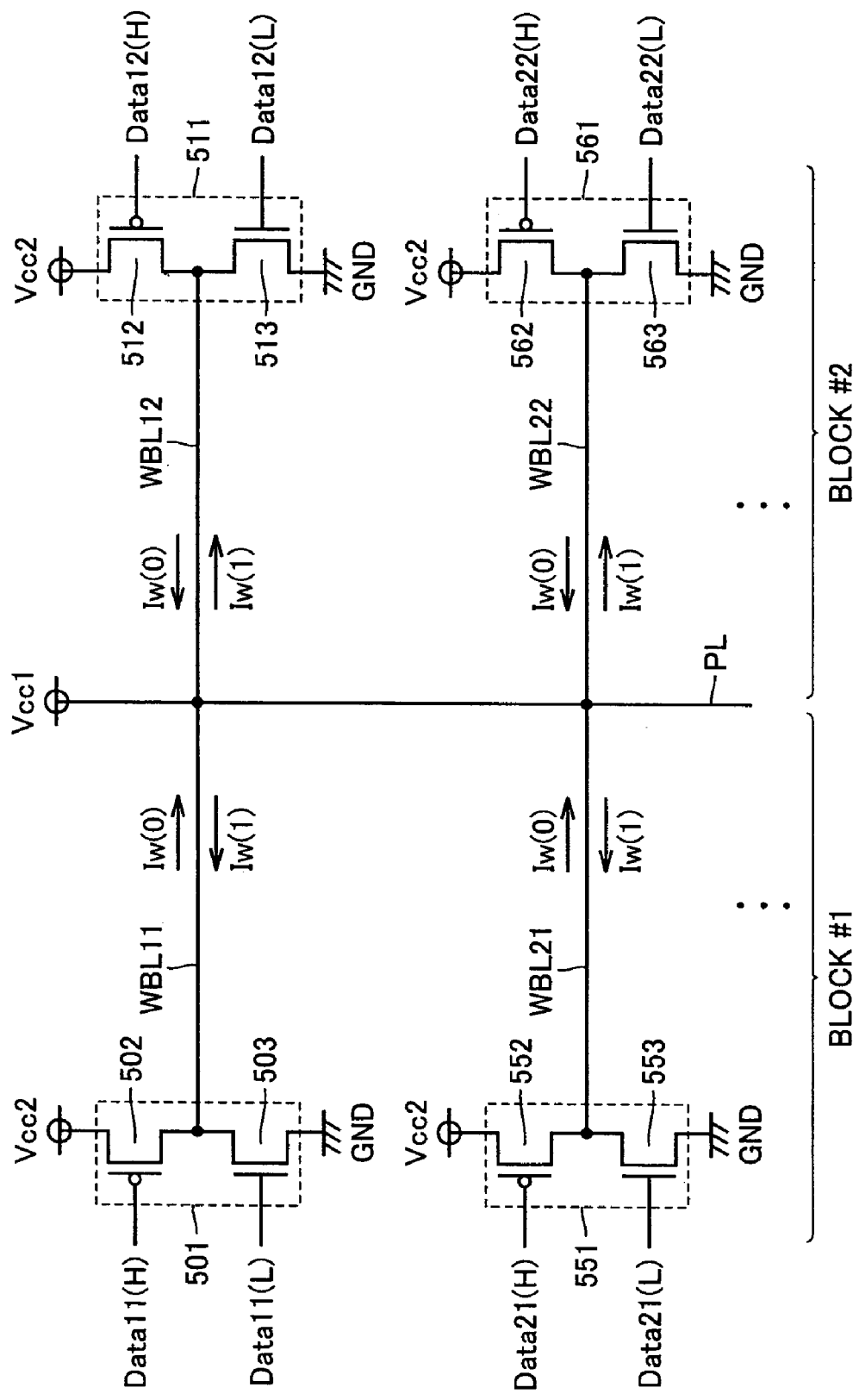
FIG. 14 is a circuit diagram representing a configuration of a data write driver of the MRAM in accordance with a third embodiment.

FIG. 14 is a circuit diagram representing a configuration of a data write driver of the MRAM in accordance with the third embodiment.

Referring to FIG. 14, in the MRAM in accordance with the third embodiment, a memory area including a plurality of MTJ memory cells MCs and a plurality of dummy MTJ memory cells DMCs arranged in a matrix of rows and columns is divided into at least one area, with each of the at least one area being divided into two blocks. In FIG. 14, blocks #1 and #2 of one such area are shown and the description will be given in the following with reference to the shown portions.

Block #1 includes current drivers 501 and 551, and corresponding write bit lines WBL11 and WBL21. Block #2 includes current drivers 511 and 561, and corresponding write bit lines WBL12 and WBL22. Current drivers 501, 551, 511 and 561 all receive power supply voltage Vcc2 and the ground voltage GND.

Write bit lines WBL11 and WBL21 of block #1 and write bit lines WBL12 and WBL22 of block #2 are connected to common line PL to which power supply voltage Vcc1 is applied. The common line PL serves as an "at least one block common line."

The operation of the data write driver is the same as that of the data write driver in accordance with the first embodiment. Though common line PL is shared by adjacent blocks, it is possible to write data simultaneously in adjacent blocks.

Though not specifically shown, in the third embodiment also, modifications similar to the first to fifth modifications of the first embodiment may be made.

As described above, in the MRAM in accordance with the third embodiment, common line PL is shared by adjacent blocks, and by this arrangement also, the size of the device can be reduced.

[Fourth Embodiment]

Figure 15:
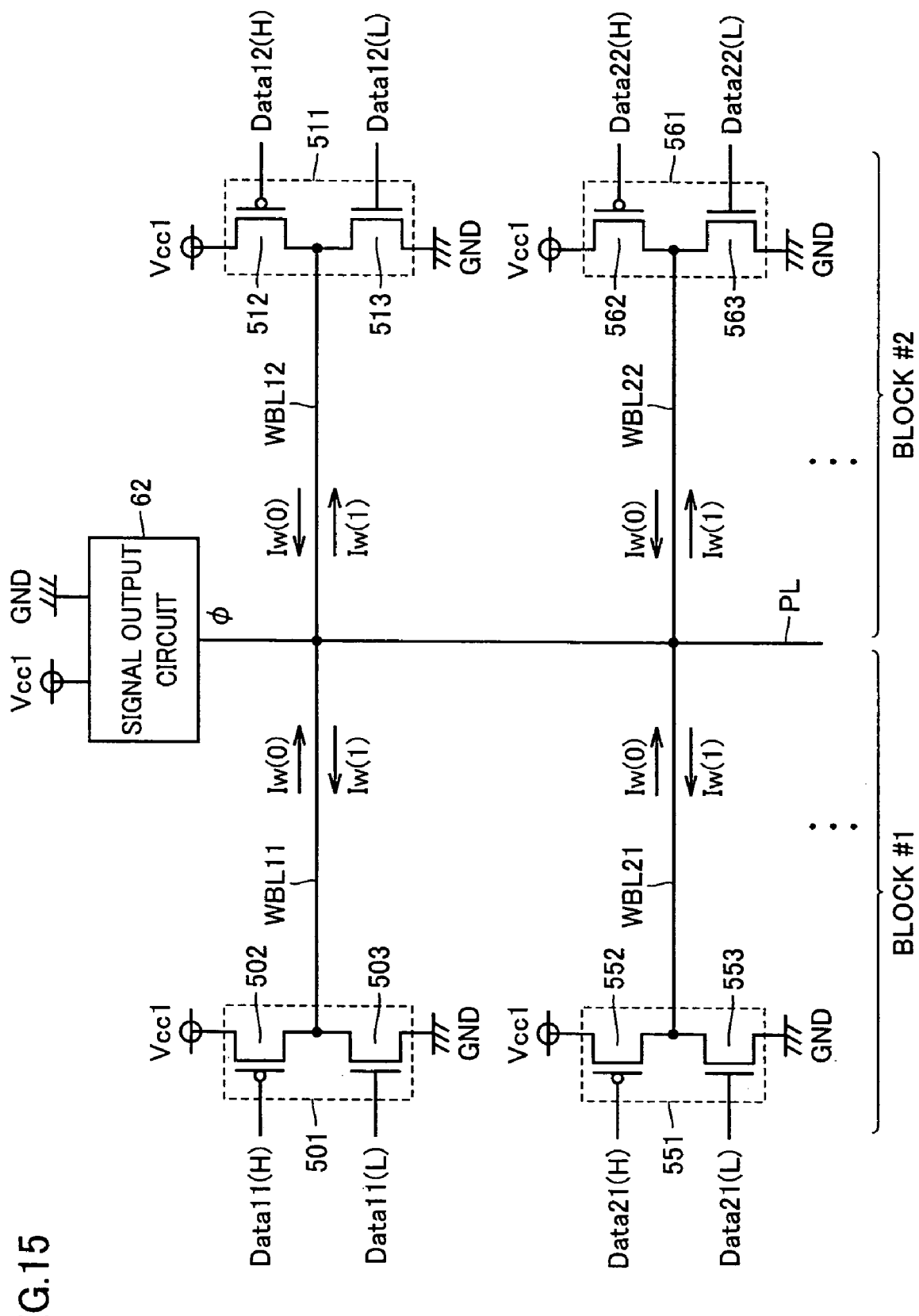
FIG. 15 is a circuit diagram representing a configuration of a data write driver of the MRAM in accordance with a fourth embodiment.

FIG. 15 is a circuit diagram representing a configuration of a data write driver of the MRAM in accordance with the fourth embodiment.

Referring to FIG. 15, in the MRAM in accordance with the fourth embodiment, as in the third embodiment, a memory area including a plurality of MTJ memory cells MCs and a plurality of dummy MTJ memory cells DMCs arranged in a matrix of rows and columns is divided into at least one area, with each of the at least one area being divided into two blocks. In FIG. 15 also, only the blocks #1 and #2 of one such block are shown and the description will be given in the following with reference to the shown portions.

The configuration of blocks #1 and #2 is the same as that of each block described with reference to the third embodiment. It is noted, however, that different from the third embodiment, power supply voltage Vcc1 is supplied in place of the power supply voltage Vcc2 to current drivers 501, 551, 511 and 561 included in blocks #1 and #2. Write bit lines WBL11 and WBL21 of block #1 and write bit lines WBL12 and WBL22 of block #2 are all connected to common line PL, and signal output circuit 62 is connected to common line PL. As signal output circuit 62 has already been described, description thereof will not be repeated. The common line PL serves as an "at least one block common line."

The operation of the data write driver is basically the same as that of the data write driver in accordance with the second embodiment. It is noted, however, that when the current driver of block #1 is active, the current driver of adjacent block #2 is not activated, and when the current driver of block #2 is active, the current driver of adjacent block #1 is not activated.

Though not specifically shown, in the fourth embodiment, modifications similar to the first and third to fifth modifications of the first embodiment may be made.

As described above, effects comparable to those of the second embodiment can be attained by the MRAM in accordance with the fourth embodiment. Further, common line PL is shared by adjacent blocks, and by this arrangement also, the size of the device can be reduced.

[Fifth Embodiment]

In the MRAM, the magnetic field for data writing generated in an adjacent write bit line may have an undesirable influence on the write bit line of interest, causing a problem. In the fifth embodiment, the configuration of the data write driver in accordance with the second embodiment additionally includes a circuit for canceling the influence of the magnetic field for data writing generated in the adjacent write bit line.

Figure 16:
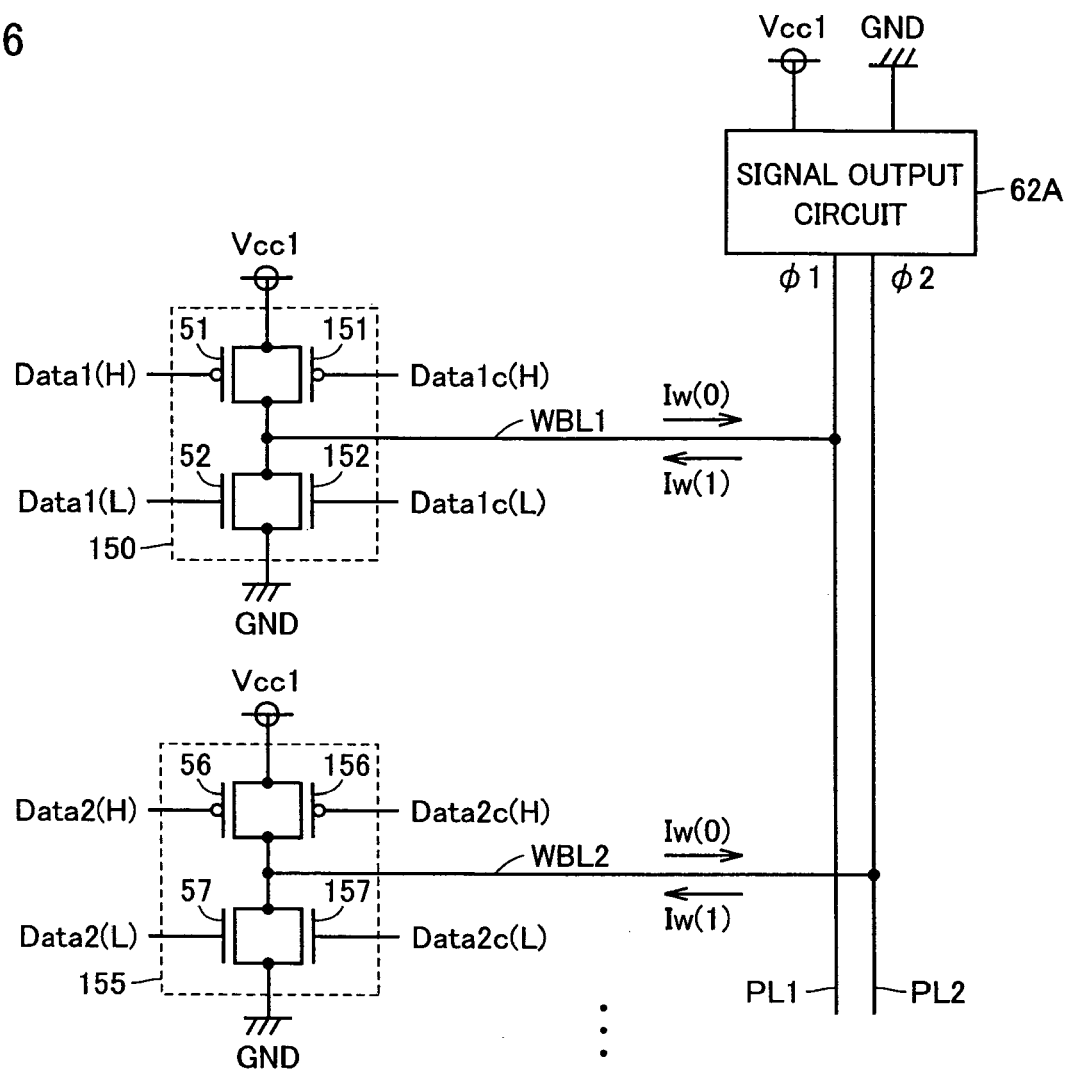
FIG. 16 is a circuit diagram representing a configuration of a data write driver of the MRAM in accordance with a fifth embodiment.

FIG. 16 is a circuit diagram representing a configuration of a data write driver of the MRAM in accordance with the fifth embodiment. In FIG. 16 also, only the write bit lines WBL1 and WBL2 of the first and second columns and corresponding portions are shown as representatives, and description will be given with reference to the portions shown in the figure.

Referring to FIG. 16, the data write driver of the MRAM has a configuration corresponding to that of the data write driver in accordance with the second embodiment shown in FIG. 12, with current drivers 50 and 55 replaced by current drivers 150 and 155, and signal output circuit 62 replaced by signal output circuit 62A, respectively. Further, in place of common line PL, two common lines PL1 and PL2 are provided, and write bit lines WBL1 and WBL2 are connected to common lines PL1 and PL2, respectively.

Current driver 150 includes, in addition to the configuration of current driver 50, a P-channel MOS transistor 151 and an N-channel MOS transistor 152. P-channel MOS transistor 151 is connected between power supply voltage Vcc1 and write bit line WBL1, and receives at its gate a write control signal Data1c(H) output from write control circuit 40. N-channel MOS transistor 152 is connected between write bit line WBL1 and the ground voltage GND, and receives at its gate a write control signal Data1c(L) output from write control circuit 40.

Current driver 155 includes, in addition to the configuration of current driver 55, a P-channel MOS transistor 156 and an N-channel MOS transistor 157. P-channel MOS transistor 156 is connected between power supply voltage Vcc1 and write bit line WBL2, and receives at its gate a write control signal Data2c(H) output from write control circuit 40. N-channel MOS transistor 157 is connected between write bit line WBL2 and the ground voltage GND, and receives at its gate a write control signal Data2c(L) output from write control circuit 40.

P-channel MOS transistors 151 and 156 and N-channel MOS transistors 152 and 157 are driver transistors (hereinafter also referred to as "cancel drivers") causing a cancel current to flow through the corresponding write bit lines, for canceling the influence of the magnetic field for data writing from adjacent write bit lines. The cancel drivers are each set to a size necessary and sufficient to cancel the influence of the magnetic filed for data writing received from the adjacent bit line.

The write control signals Datajc(H) and Datajc(L) (j is a natural number) received by the cancel drivers at their gates in the fifth embodiment are generated in accordance with the equations below.

$$\text{Data}jc(H) = /(\text{Data}j+1(L) \text{ OR Data}j-1(L)) \quad (1)$$

$$\text{Data}jc(L) = /\text{Data}j+1(H) \text{ OR }/\text{Data}j-1(H) \quad (2)$$

Equation (1) represents that when an N-channel MOS transistor turns ON in the current driver corresponding to any of adjacent write bit lines, the P-channel cancel driver in the current driver corresponding to the write bit line of interest is turned ON. Equation (2) represents that when a P-channel MOS transistor turns ON in the current driver corresponding to any of adjacent write bit lines, the N-channel cancel driver in the current driver corresponding to the write bit line of interest is turned ON. By this operation, when a current for data writing flows through an adjacent write bit line, it is possible to cause a cancel current in a direction opposite to the data writing current to flow through the write bit line of interest.

Signal output circuit 62A receives power supply voltage Vcc1 and the ground voltage GND, generates φ1 and φ2 signals, and outputs these signals to common lines PL1 and PL2, respectively. Here, the φ1 signal corresponds to the φ signal described above, and the φ2 signal is a signal of opposite phase to the φ1 signal in a period when the current driver is active.

Figure 17:
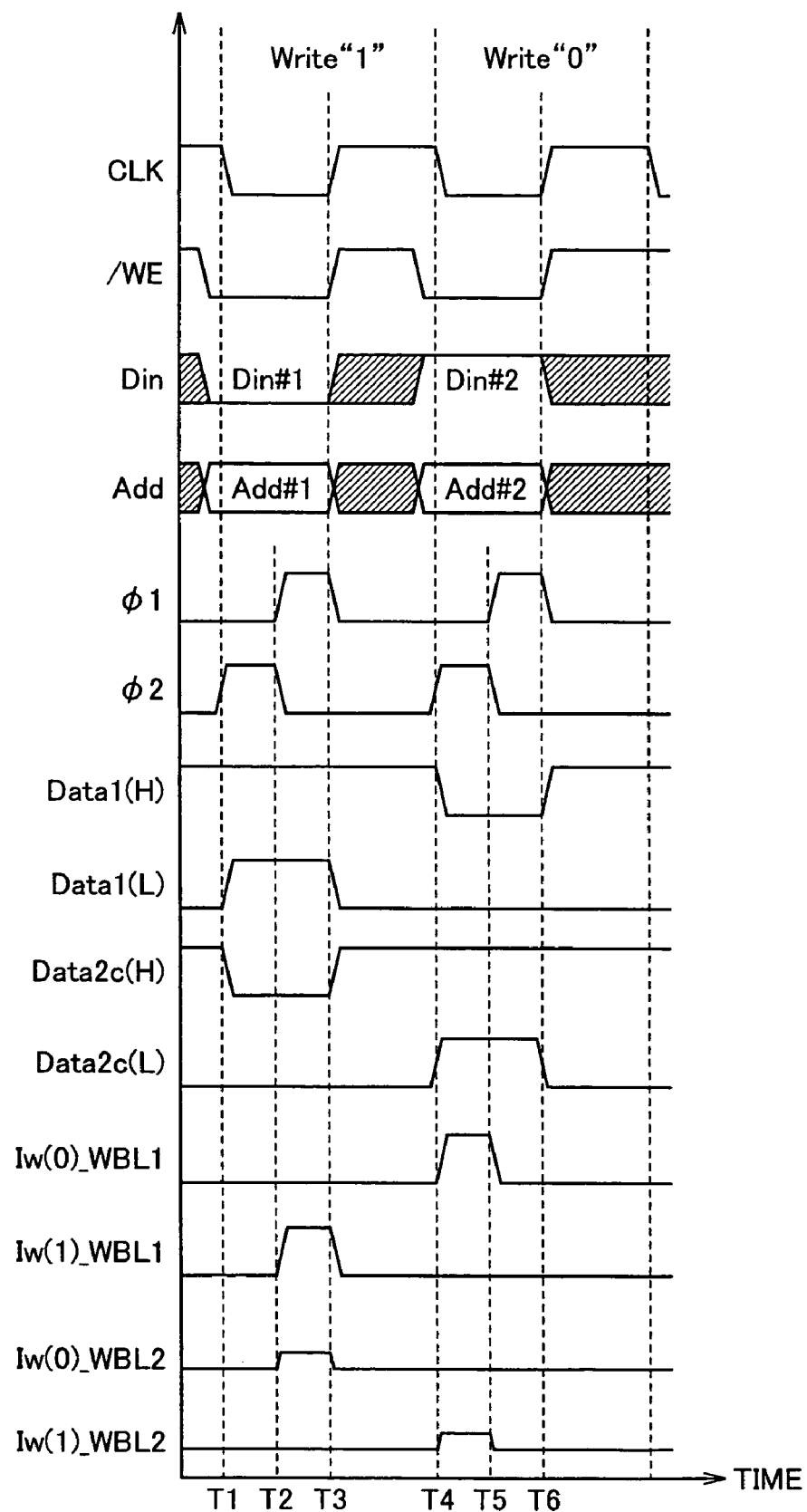
FIG. 17 is a diagram of waveforms representing an operation of the data write driver shown in FIG. 16.

FIG. 17 is a diagram of waveforms representing an operation of the data write driver shown in FIG. 16. In FIG. 17 also, as in other waveforms described above, it is assumed that the write data Din#1, that is, data "1" is written to the selected memory cell connected to write bit line WBL1 from T1 to T3, and the write data Din#2, that is, data "0" is written to the selected memory cell connected to write bit line WBL1 from T4 to T6.

Referring to FIG. 17, at time point T1, when the clock signal CLK falls, write control signals Data1(H) and Data1(L) both attain to the H level in accordance with the column selecting signal CSL and write data Din#1, and in response, P-channel MOS transistor 51 and N-channel MOS transistor 52 turn OFF and ON, respectively. Further, in accordance with equations (1) and (2) described above, write control signals Data2c(H) and Data2c(L) both attain to the L level, and in response, P-channel MOS transistor 156 and N-channel MOS transistor 157 turn ON and OFF, respectively.

At time point T1, signal output circuit 62A outputs φ1 and φ2 signals at L level and H level, respectively. At this time, opposite ends of write bit line WBL1 are both at the ground voltage GND, and the current for data writing does not flow through write bit line WBL1. Opposite ends of write bit line WBL2 are both at the power supply voltage Vcc1, and therefore, cancel current does not flow through write bit line WBL2, either.

At time point T2, when signal output circuit 62A inverts φ1 and φ2 signals to H level and L level, respectively, the current Iw (1) for data writing flows through write bit line WBL1 in a direction from common line PL1 to current driver 150, based on the potential difference between the power supply voltage Vcc1 of common line PL1 and the ground voltage GND received by current driver 150. On the other hand, the cancel current Iw (0) flows through write bit line WBL2 in a direction from current driver 155 to common line PL2, based on the potential difference between the power supply voltage Vcc1 received by current driver 155 and the ground voltage GND of common line PL2.

Next, at time point T4, when the clock signal CLK falls, write control signals Data1(H) and Data1(L) both attain to the L level in accordance with the column selecting signal CSL and write data Din#2, and in response, P-channel MOS transistor 51 and N-channel MOS transistor 52 turn ON and OFF, respectively. Further, in accordance with equations (1) and (2) above, write control signals Data2c(H) and Data2c(L) both attain to the H level, and in response, P-channel MOS transistor 156 and N-channel MOS transistor 157 turn OFF and ON, respectively.

Further, signal output circuit 62A outputs φ1 and φ2 signals at L level and H level, respectively. At this time, the current Iw (0) for data writing flows through write bit line WBL1 in a direction from current driver 150 to common line PL1, based on the potential difference between the power supply voltage Vcc1 received by current driver 150 and the ground voltage GND of common line PL1. On the other hand, cancel current Iw(1) flows through write bit line WBL2 in a direction from common line PL2 to current driver 155, based on the voltage difference between the power supply voltage Vcc1 of common line PL2 and the ground voltage GND received by current driver 155.

At time point T5, when signal output circuit 62A inverts φ1 and φ2 signals to the H level and L level, respectively, opposite ends of write bit line WBL1 both attain to the power supply voltage Vcc1, and therefore, the current Iw(0) for data writing through write bit line WBL1 attains to 0. Further, opposite ends of write bit line WBL2 both attain to the ground voltage GND, and therefore, cancel current Iw(1) through write bit line WBL2 also attains to 0.

As described above, effects comparable to those of the second embodiment can be attained by the MRAM in accordance with the fifth embodiment. Further, in the MRAM, influence of the magnetic field for data writing from an adjacent write bit line can be cancelled, and therefore, operation margin at the time of data writing can be improved.

[Modification of the Fifth Embodiment]

In the fifth embodiment, current drivers 150 and 155 are arranged on the same side of corresponding write bit lines WBL1 and WBL2, respectively, as shown in FIG. 16. In the modification of the fifth embodiment, the current drivers are arranged alternately on left and right sides, for every write bit line.

Figure 18:
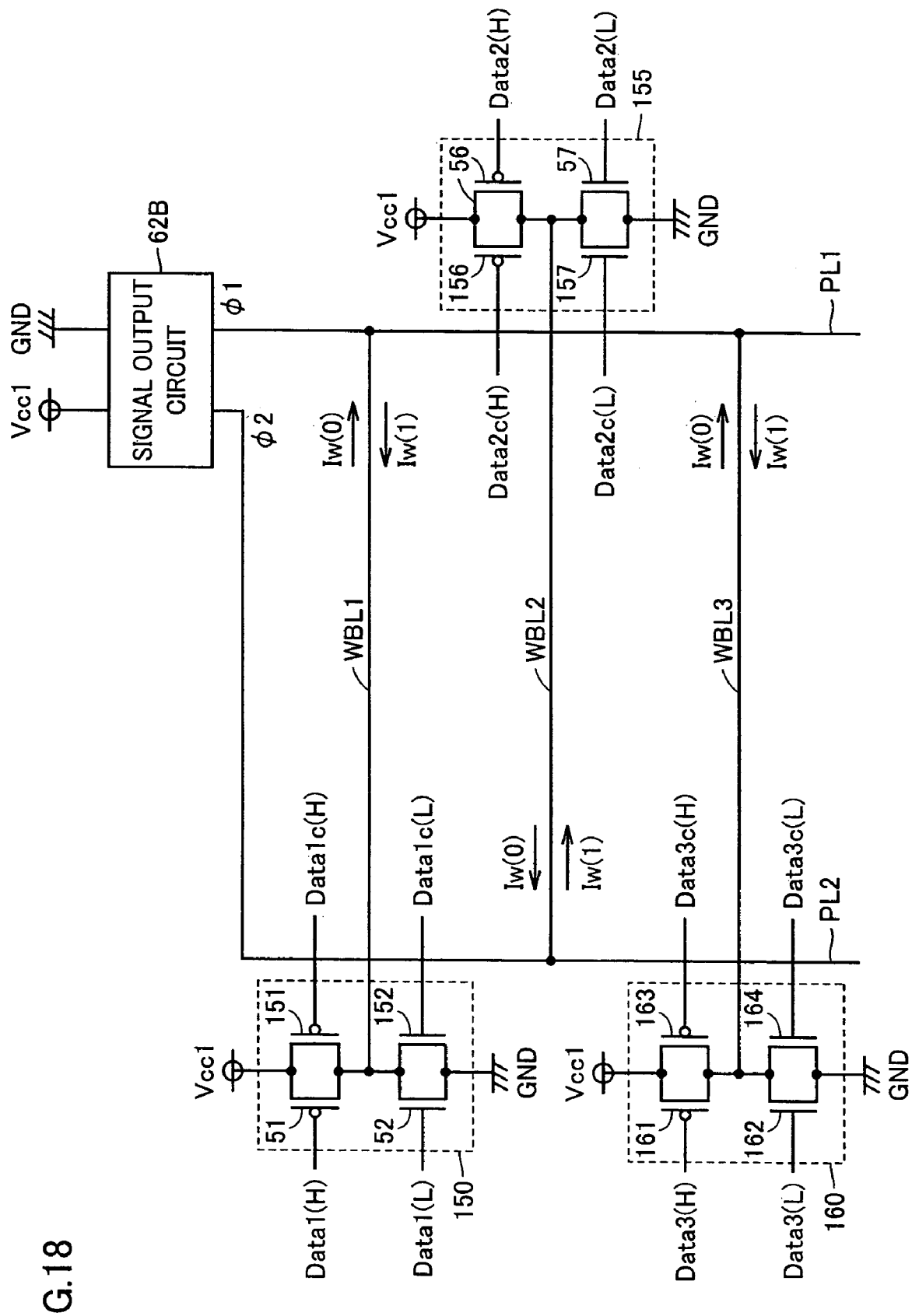
FIG. 18 is a circuit diagram representing a configuration of a data write driver of the MRAM in accordance with a modification of the fifth embodiment.

FIG. 18 is a circuit diagram representing a configuration of a data write driver of the MRAM in accordance with a modification of the fifth embodiment. In FIG. 18, only the portions corresponding to write bit lines WBL1 to WBL3 of the first to third columns are shown, and description will be given with reference to the portions shown in the figure.

Referring to FIG. 18, a current driver 160 is provided corresponding to write bit line WBL3. Common lines PL1 and PL2 are provided on opposite sides of write bit lines WBL1, WBL2, WBL3, . . . . Write bit lines WBL1 and WBL3 are connected, at one end, to common line PL1, and at the other end, current drivers 150 and 160, respectively. Write bit line WBL2 is connected, at one end, to common line PL2, and at the other end, current driver 155.

Here, write control signals Data$jc$(H) and Data$jc$(L) received by the gate of the cancel driver in accordance with the modification of the fifth embodiment are generated in accordance with the following equations.

$$\text{Data}jc(H)=/(/\text{Data}j+1(H)\text{OR }/\text{Data}j-1(H)) \qquad (3)$$

$$\text{Data}jc(L)=\text{Data}j+1(L)\text{OR Data}j-1(L) \qquad (4)$$

Equation (3) represents that when a P-channel MOS transistor turns ON in the current driver corresponding to any of adjacent write bit lines, the P-channel cancel driver in the current driver of the write bit line of interest is turned ON. Equation (4) represents that when an N-channel MOS transistor turns ON in the current driver corresponding to any of adjacent write bit lines, the N-channel cancel driver in the current driver of the write bit line of interest is turned ON.

Signal output circuit 62B receives the power supply voltage Vcc1 and the ground voltage GND, generates φ1 and φ2 signals and outputs these signals to common lines PL1 and PL2, respectively. Here, the φ1 and φ2 signals correspond to the φ signal described above. Specifically, signal output circuit 62A of the fifth embodiment outputs the φ2 signal in a phase opposite to the φ1 signal, while signal output circuit 62B outputs the φ2 signal in the same phase as the φ1 signal.

Figure 19:
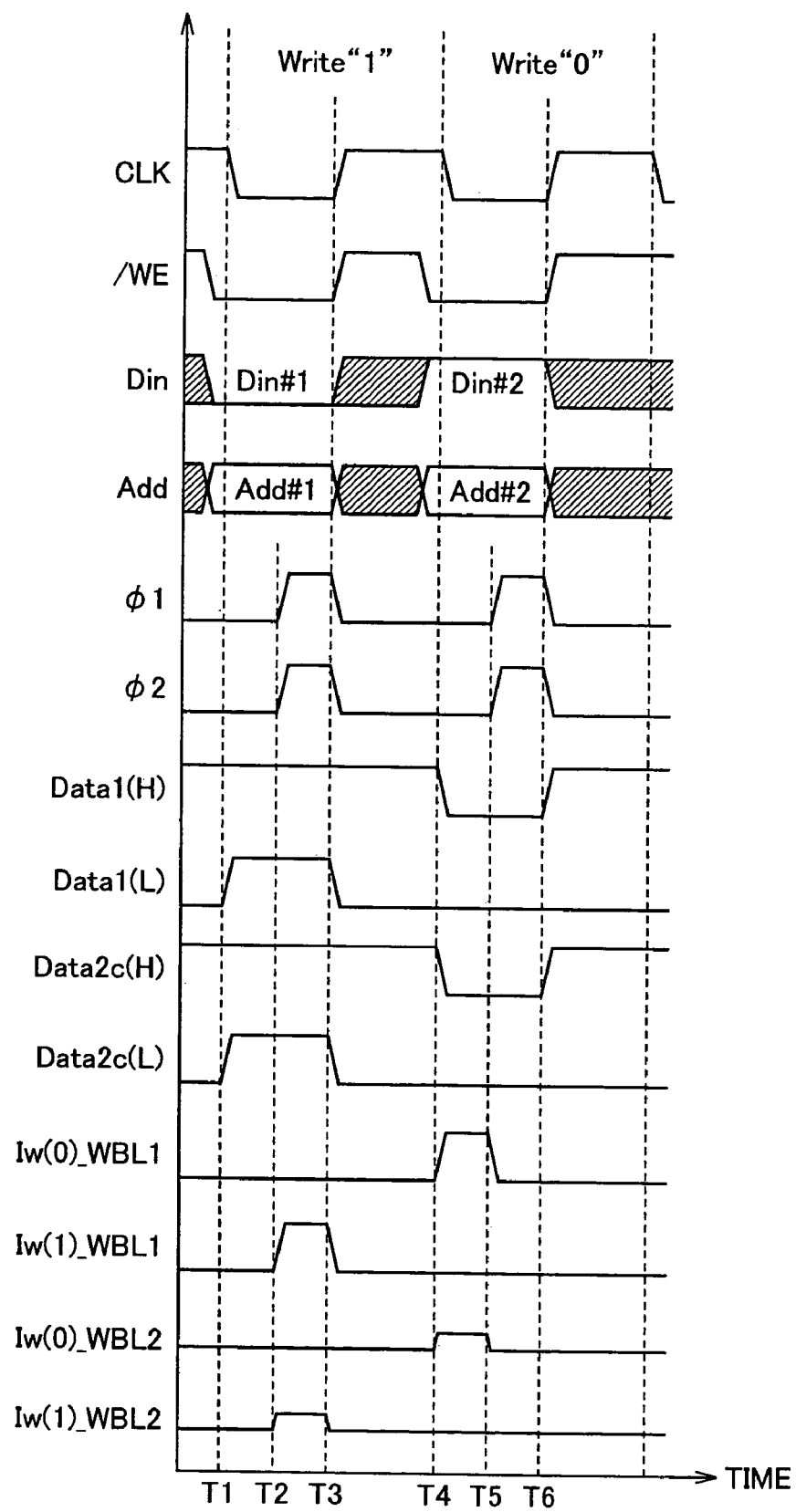
FIG. 19 is a diagram of waveforms representing an operation of the data write driver shown in FIG. 18.

FIG. 19 is a diagram of waveforms representing an operation of the data write driver shown in FIG. 18. In FIG.

19 also, as in other waveforms described above, it is assumed that the write data Din#1, that is, data "1" is written to the selected memory cell connected to write bit line WBL1 from T1 to T3, and the write data Din#2, that is, data "0" is written to the selected memory cell connected to write bit line WBL1 from T4 to T6.

Referring to FIG. 19, at time point T1, when the clock signal CLK falls, P-channel MOS transistor 51 and N-channel MOS transistor 52 turn OFF and ON, respectively, as described with reference to other waveforms above. Further, in accordance with equations (3) and (4), write control signals Data2c(H) and Data2c(L) both attain to the H level, and in response, P-channel MOS transistor 156 and N-channel MOS transistor 157 turn OFF and ON, respectively.

Further, signal output circuit 62B outputs φ1 and φ2 signals both at the L level. At this time, opposite ends of write bit line WBL1 are both at the ground voltage GND, and the current for data writing does not flow through write bit line WBL1. Further, opposite ends of write bit line WBL2 are both at the ground voltage GND, and therefore, cancel current does not flow through write bit line WBL2, either.

At time point T2, when signal output circuit 62B inverts the φ1 and φ2 signals to the H level, the current Iw (1) for data writing flows through write bit line WBL1 in a direction from common line PLI to current driver 150, based on the potential difference between the power supply voltage Vcc1 of common line PL1 and the ground voltage GND received by current driver 150. Further, the cancel current Iw (1) flows through write bit line WBL2 in a direction from common line PL2 to current driver 155, based on the potential difference between the power supply voltage Vcc1 of common line PL2 and the ground voltage GND received by current driver 155.

Next, at time point T4, when the clock signal CLK falls, P-channel MOS transistor 51 and N-channel MOS transistor 52 turn ON and OFF, respectively, as in the waveforms above. Further, in accordance with equations (3) and (4) described above, write control signals Data2c(H) and Data2c(L) both attain to the L level, and in response, P-channel MOS transistor 156 and N-channel MOS transistor 157 turn ON and OFF, respectively.

Further, signal output circuit 62B outputs the φ1 and φ2 signals both at the L level. Therefore, the current Iw (0) for data writing flows through write bit line WBL1 in a direction from current driver 150 to common line PL1, based on the potential difference between the power supply voltage Vcc1 received by current driver 150 and the ground voltage GND of common line PL1. The cancel current Iw (0) flows through write bit line WBL2 in a direction from current driver 155 to common line PL2, based on the potential difference between the power supply voltage Vcc1 received by current driver 155 and the ground voltage GND of common line PL2.

At time point T5, when signal output circuit 62B inverts the φ1 and φ2 signals both to the H level, opposite ends of write bit line WBL1 both attain to the power supply voltage Vcc1, and the current Iw (0) for data writing through write bit line WBL1 attains to 0. Further, opposite ends of write bit line WBL2 both attain to the power supply voltage Vcc1, and therefore, the cancel current Iw (0) through write bit line WBL2 also attains to 0.

As described above, in the MRAM in accordance with the modification of the fifth embodiment, layout efficiency of current drivers can be improved, and in addition, signal control becomes easier, as the φ1 and φ2 signals output from signal output circuit 62B are of the same phase.

Though not specifically shown, in the fifth embodiment, modifications similar to the third to fifth modifications of the first embodiment may be made.

[Sixth Embodiment]

The sixth embodiment includes, in addition to the configuration of the data write driver in accordance with the first embodiment, a circuit for canceling the influence of magnetic field for data writing generated in an adjacent bit line.

Figure 20:
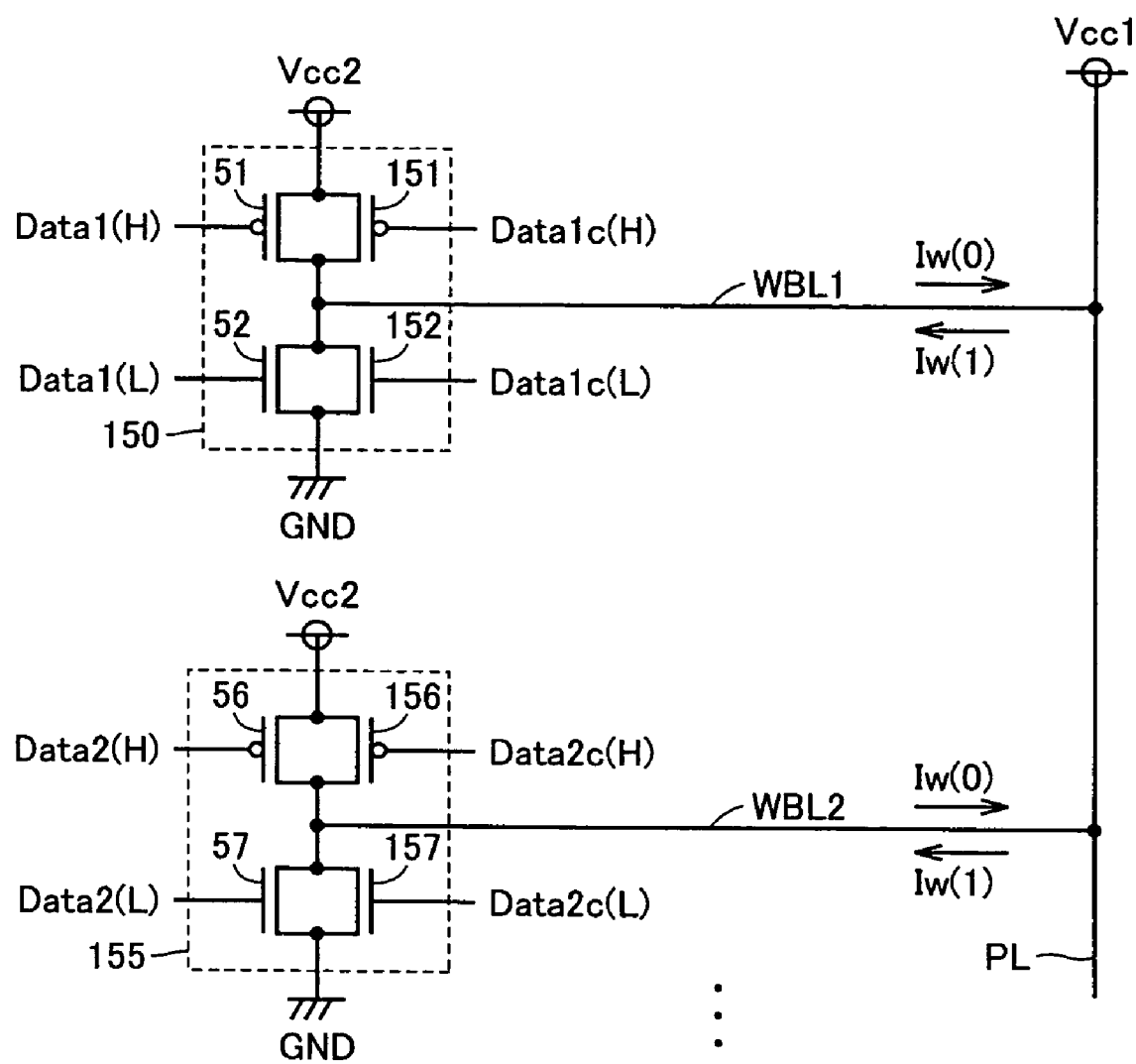
FIG. 20 is a circuit diagram representing a configuration of a data write driver of the MRAM in accordance with a sixth embodiment.

FIG. 20 is a circuit diagram representing a configuration of a data write driver of the MRAM in accordance with the sixth embodiment. In FIG. 20 also, only the portions corresponding to write bit lines WBL1 and WBL2 of the first and second columns are shown, and the description will be given with reference to the portions shown in the figure.

Referring to FIG. 20, the data write driver includes the configuration of the data write driver in accordance with the first embodiment, with current drivers 50 and 55 replaced by current drivers 150 and 155, respectively. In the sixth embodiment, current drivers 150 and 155 both receive the power supply voltage Vcc2 and the ground voltage GND. As the configuration of current drivers 150 and 155 have already been described, description thereof will not be repeated.

In the sixth embodiment, write control signals Datajc(H) and Datajc(L) to be received by the gate of the cancel driver are generated in accordance with equations (1) and (2) described above.

Figure 21:
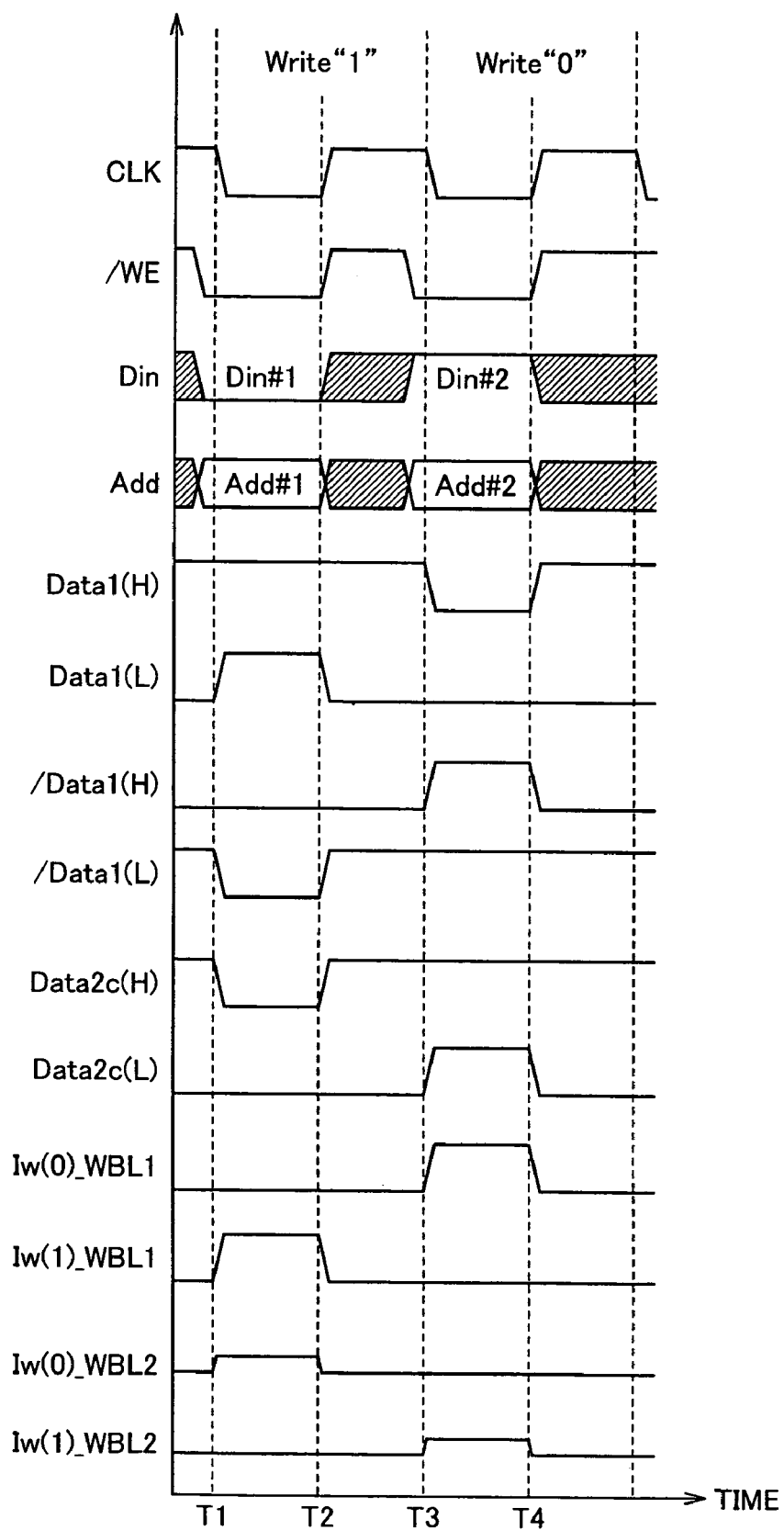
FIG. 21 is a diagram of waveforms representing an operation of the data write driver shown in FIG. 20.

FIG. 21 is a diagram of waveforms representing an operation of the data write driver shown in FIG. 20. In FIG. 21 also, as in other waveforms described above, it is assumed that the write data Din#1, that is, data "1" is written to the selected memory cell connected to write bit line WBL1 from T1 to T2, and the write data Din#2, that is, data "0" is written to the selected memory cell connected to write bit line WBL1 from T3 to T4.

Referring to FIG. 21, at time point T1, when the clock signal CLK falls, write control signals Data1(H) and Data1(L) both attain to the H level in accordance with the column selecting signal CSL and write data Din#1, and in response, P-channel MOS transistor 51 and N-channel MOS transistor 52 turn OFF and ON, respectively. Then, the current Iw (1) for data writing flows through write bit line WBL1 in a direction from common line PL to current driver 150, based on the potential difference between the power supply voltage Vcc1 of common line PL and the ground voltage GND received by current driver 150.

Meanwhile, in accordance with equations (1) and (2) described above, write control signals Data2c(H) and Data2c(L) both attain to the L level, and in response, P-channel MOS transistor 156 and N-channel MOS transistor 157 turn ON and OFF, respectively. Then, the cancel current Iw(0) flows through write bit line WBL2 in a direction from current driver 155 to common line PL, based on the voltage difference between the power supply voltage Vcc2 received by current driver 155 and the power supply voltage Vcc1 of common line PL.

At time point T3, when the clock signal CLK falls, write control signals Data1(H) and Data1(L) both attain to the L level in accordance with the column selecting signal CSL and write data Din#2, and in response, P-channel MOS transistor 51 and N-channel MOS transistor 52 turn ON and OFF, respectively. Then, the current Iw(0) for data writing flows through write bit line WBL1 in a direction from current driver 150 to common line PL, based on the potential difference between the power supply voltage Vcc2 received by current driver 150 and the power supply voltage Vcc1 of common line PL.

Meanwhile, in accordance with equations (1) and (2) described above, write control signals Data2c(H) and Data2c(L) both attain to the H level, and in response, P-channel MOS transistor 156 and N-channel MOS transistor 157 turn OFF and ON, respectively. Then, the cancel current Iw(1) flows through write bit line WBL2 in a direction from common line PL to current driver 155, based on the voltage difference between the power supply voltage Vcc1 of common line PL and the ground voltage GND received by current driver 155.

As described above, by the MRAM in accordance with the sixth embodiment also, effects similar to that of the first embodiment can be attained. Further, as the influence of magnetic field for data writing from an adjacent write bit line can be cancelled, operation margin at the time of data writing can be improved.

[Modification of the Sixth Embodiment]

In the modification of the sixth embodiment, different from the sixth embodiment, the current drivers are arranged alternately on left and right sides, for every write bit line.

Figure 22:
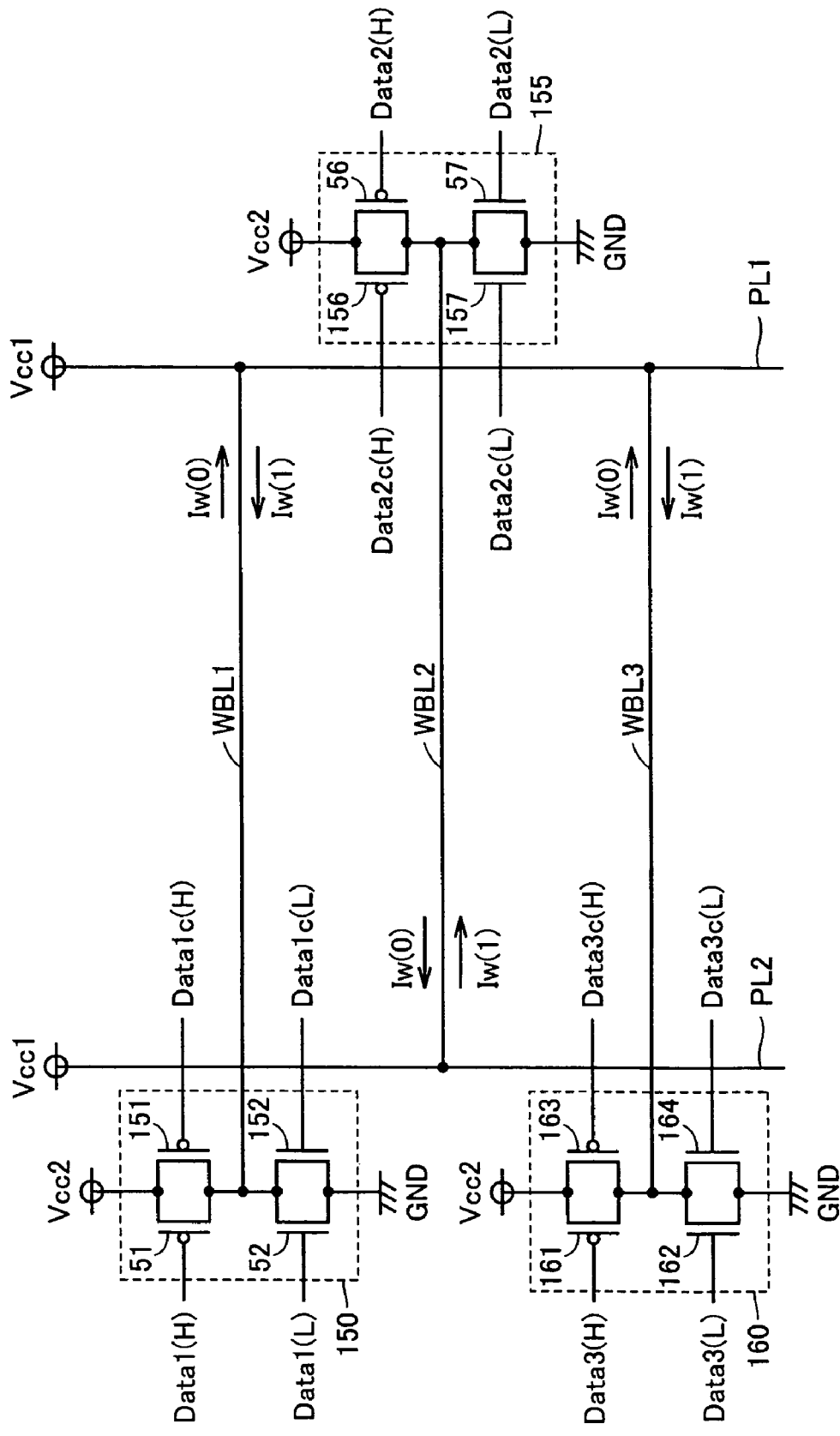
FIG. 22 is a circuit diagram representing a configuration of a data write driver of the MRAM in accordance with a modification of the sixth embodiment.

FIG. 22 is a circuit diagram representing a configuration of a data write driver of the MRAM in accordance with a modification of the sixth embodiment. In FIG. 22, portions corresponding to write bit lines WBL1 to WBL3 of the first to third columns are shown, and the description will be given with reference to the portions shown in the figure.

Referring to FIG. 22, configurations and arrangements of write bit lines WBL1 to WBL3, corresponding current drivers 150, 155 and 160, and common lines PL1 and PL2 are the same as those of the modification of the fifth embodiment shown in FIG. 18. Current drivers 150, 155 and 160 receive the power supply voltage Vcc2 and the ground voltage GND. The power supply voltage Vcc1 is applied to common lines PL1 and PL2. As the configuration of current drivers 150, 155 and 160 have already been described, description thereof will not be repeated.

In the modification of the sixth embodiment, write control signals Datajc(H) and Datajc(L) received at the gate of the cancel driver are generated in accordance with equations (3) and (4) described above.

Figure 23:
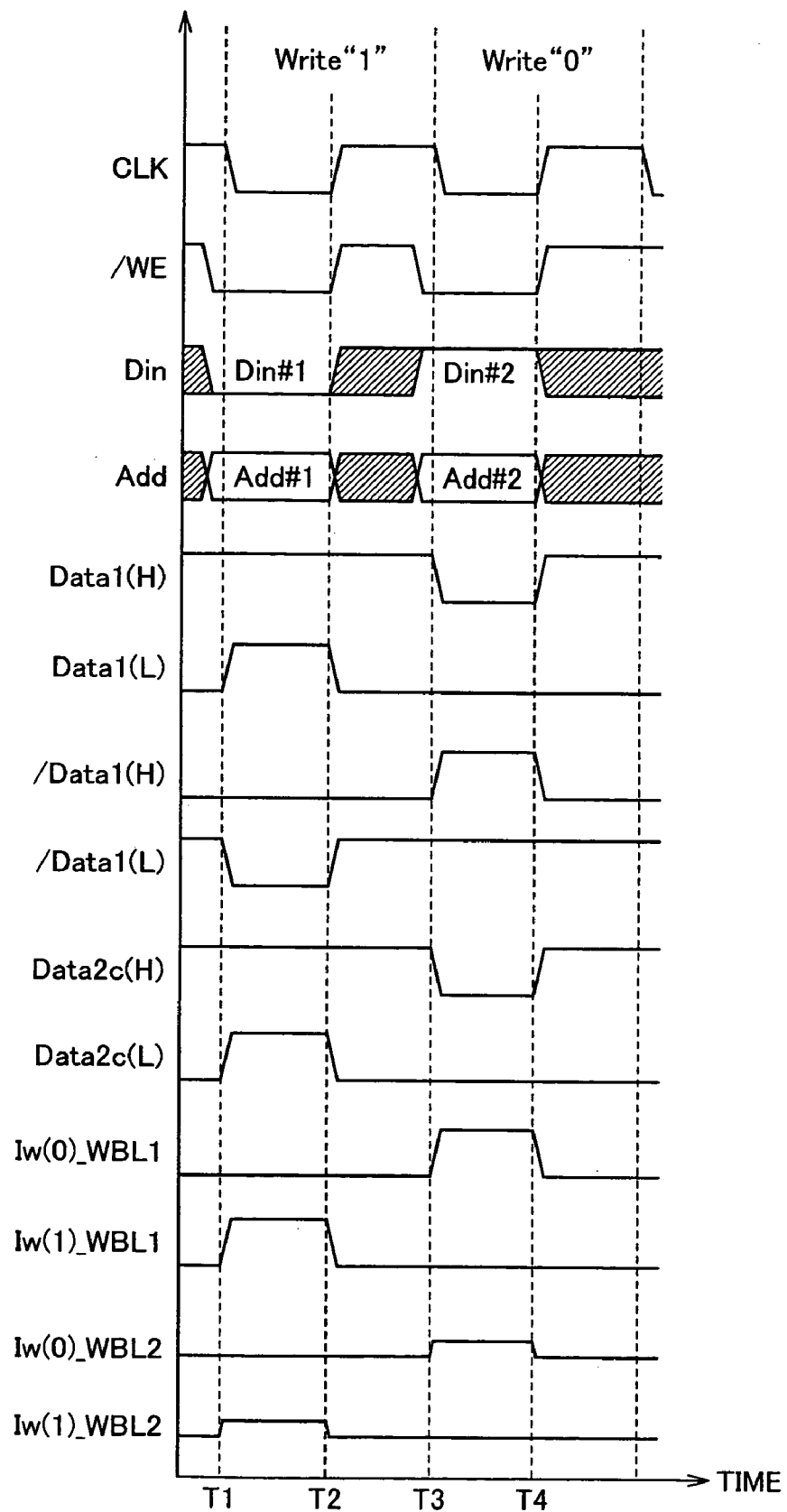
FIG. 23 is a diagram of waveforms representing an operation of the data write driver shown in FIG. 22.

FIG. 23 is a diagram of waveforms representing an operation of the data write driver shown in FIG. 22. In FIG. 23 also, as in other waveforms described above, it is assumed that the write data Din#1, that is, data "1" is written to the selected memory cell connected to write bit line WBL1 from T1 to T2, and the write data Din#2, that is, data "0" is written to the selected memory cell connected to write bit line WBL1 from T3 to T4.

Referring to FIG. 23, at time point T1, when the clock signal CLK falls, write control signals Data1(H) and Data1 (L) both attain to the H level in accordance with the column selecting signal CSL and write data Din#1, and in response, P-channel MOS transistor 51 and N-channel MOS transistor 52 turn OFF and ON, respectively. Then, the current Iw(1) for data writing flows through write bit line WBL1 in a direction from common line PL1 to current driver 150, based on the potential difference between the power supply voltage Vcc1 of common line PL1 and the ground voltage GND received by current driver 150.

Meanwhile, in accordance with equations (3) and (4) described above, write control signals Data2c(H) and Data2c(L) both attain to the H level, and in response, P-channel MOS transistor 156 and N-channel MOS transistor 157 turn OFF and ON, respectively. Then the cancel current Iw(1) flows through write bit line WBL2 in a direction from common line PL2 to current driver 155, based on the voltage difference between the power supply voltage Vcc1 of common line PL2 and the ground voltage GND received by current driver 155.

At time point T3, when the clock signal CLK falls, write control signals Data1(H) and Data1(L) both attain to the L level in accordance with the column selecting signal CSL and write data Din#1, and in response, P-channel MOS transistor 51 and N-channel MOS transistor 52 turn ON and OFF, respectively. Then, the current Iw (0) for data writing flows through write bit line WBL1 in a direction from current driver 150 to common line PL1, based on the potential difference between the power supply voltage Vcc2 received by current driver 150 and the power supply voltage Vcc1 of common line PL1.

Meanwhile, in accordance with equations (3) and (4) described above, write control signals Data2c(H) and Data2c(L) both attain to the L level, and in response, P-channel MOS transistor 156 and N-channel MOS transistor 157 turn ON and OFF, respectively. Then, the cancel current Iw (0) flows through write bit line WBL2 in a direction from current driver 155 to common line PL2, based on the voltage difference between the power supply voltage Vcc2 received by current driver 155 and the power supply voltage Vcc1 of common PL2.

As described above, in the MRAM in accordance with the modification of the sixth embodiment, similar effects as the sixth embodiment can be attained, and in addition, layout efficiency of current drivers can be improved.

Though not specifically shown, in the sixth embodiment, modifications similar to the second to fifth modifications of the first embodiment may be made.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells arranged in a matrix of rows and columns;
   a plurality of data write lines provided corresponding to the rows or columns of said plurality of memory cells;
   a plurality of current drivers receiving a voltage of a first power supply potential and a voltage of a second power supply potential lower than said first power supply potential, each connected to one end of the corresponding data write line; and
   a common line receiving a voltage of a third power supply potential lower than said first power supply potential and higher than said second power supply potential, and connected to the other end of each of said plurality of data write lines; wherein
   each of said plurality of current drivers includes
   a first transistor causing a current for data writing to flow through said corresponding data write line in a direction from the current driver to said common line, based on potential difference between said first power supply potential and said third power supply potential applied to said common line, when a write data is of a first logic level, and
   a second transistor causing said current for data writing to flow through said corresponding data write line in a direction from said common line to the current driver, based on potential difference between said third power supply potential applied to said common line and said second power supply potential, when said write data is of a second logic level complementary to said first logic level.

2. The semiconductor memory device according to claim 1, wherein
the voltages of said first to third power supply potentials are externally supplied.

3. The semiconductor memory device according to claim 2, wherein
the voltages of said first to third power supply potentials are a power supply voltage for I/O, a ground voltage, and a power supply voltage for a logic circuit, respectively.

4. The semiconductor memory device according to claim 1, further comprising
an internal voltage down-converter circuit externally receiving the voltages of said first and second power supply potentials, and lowering the voltage of said first power supply potential to generate the voltage of said third power supply potential.

5. The semiconductor memory device according to claim 1, wherein
each of said plurality of current drivers is connected to said corresponding data write line, at an end portion opposite to the current driver connected to an adjacent data write line.

6. The semiconductor memory device according to claim 1, wherein
each of said plurality of current drivers causes a prescribed current in a direction opposite to said current for data writing to flow through said corresponding data write line, when said current for data writing is caused to flow through an adjacent data write line.

7. The semiconductor memory device according to claim 6, wherein
each of said plurality of current drivers includes
a third transistor causing said prescribed current to flow through said corresponding data write line in a direction from the current driver to said common line, based on potential difference between said first power supply potential and said third power supply potential applied to said common line, and
a fourth transistor causing said prescribed current to flow through said corresponding data write line in a direction from said common line to the current driver, based on potential difference between said third power supply potential applied to said common line and said second power supply potential.

8. The semiconductor memory device according to claim 1, wherein
said plurality of memory cells are formed in at least one area;
each of said at least one area is divided into two blocks;
said common line includes at least one block common line provided corresponding to said at least one area, respectively; and
each of said at least one block common line is shared by corresponding said two blocks.

9. The semiconductor memory device according to claim 1, wherein
each of said plurality of memory cells has a magnetic layer magnetized in a direction corresponding to a stored data, and stores write data utilizing direction of magnetization of said magnetic layer determined by the direction of current caused to flow through the data write line to which the memory cell is connected, at the time of data writing.

10. The semiconductor memory device according to claim 9, further comprising:
a plurality of read bit lines provided corresponding to the columns of said plurality of memory cells, and receiving read data; wherein
said plurality of data write lines are a plurality of write bit lines provided corresponding to the columns of said plurality of memory cells, and through which said current for data writing is caused to flow, generating a magnetic field to magnetize said magnetic layer.

11. The semiconductor memory device according to claim 9, further comprising:
a plurality of column selecting gates provided corresponding to said plurality of data write lines, each provided between the corresponding data write line and said common line; wherein
said plurality of data write lines are a plurality of bit lines provided corresponding to the columns of said plurality of memory cells, through which said current for data writing is caused to flow to generate a magnetic field for magnetizing said magnetic layer; and
each of said plurality of column selecting gates electrically separates said corresponding bit line from said common line at the time of data reading.

12. The semiconductor memory device according to claim 9, further comprising:
a plurality of write bit lines provided corresponding to the columns of said plurality of memory cells, through which a prescribed current is caused to flow in a prescribed direction at the time of data writing; and
a plurality of read bit lines provided corresponding to the columns of said memory cells, through which read data is read at the time of data reading; wherein
said plurality of data write lines are a plurality of write digit lines provided corresponding to the rows of said plurality of memory cells, through which said current for data writing is caused to flow to generate a magnetic field magnetizing said magnetic layer.

13. The semiconductor memory device according to claim 9, further comprising:
a plurality of bit lines provided corresponding to the columns of said plurality of memory cells, through which a prescribed current is caused to flow in a prescribed direction at the time of data writing, and through which read data is read at the time of data reading; and
a plurality of column selecting gates provided corresponding to said plurality of bit lines, each provided between the corresponding bit line and a data bus to which said data is read; wherein
said plurality of data write lines are a plurality of write digit lines provided corresponding to the row of said plurality of memory cells, through which said current for data writing is caused to flow to generate a magnetic field for magnetizing said magnetic layer; and
each of said plurality of column selecting gates electrically separates said corresponding bit line from said data bus at the time of data writing, and electrically connects said corresponding bit line to said data bus at the time of data reading.

14. A semiconductor memory device, comprising:
a plurality of memory cells arranged in a matrix of rows and columns;
a plurality of data write lines provided corresponding to the rows or columns of said plurality of memory cells;
a plurality of current drivers receiving a voltage of a first power supply potential and a voltage of a second power supply potential lower than said first power supply potential, each connected to one end of the corresponding data write line;

a common line connected to the other end of each of said plurality of data write lines; and a signal output circuit receiving the voltages of said first and second power supply potentials, and outputting a signal having a first logic level and a second logic level complementary to said first logic level, indicated by said first and second power supply potentials respectively, to said common line; wherein each of said plurality of current drivers includes a first transistor causing a current for data writing to flow through said corresponding data write line in a direction from the current driver to said common line, based on potential difference between said first power supply potential received by the current driver and said second power supply potential of said common line, when a write data has a first value and said signal is at said second logic level, and a second transistor causing said current for data writing to flow through said corresponding data write line in a direction from said common line to the current driver, based on potential difference between said first power supply potential of said common line and said second power supply potential received by the current driver, when said write data is of a second value complementary to said first value and said signal is at said first logic level.

15. The semiconductor memory device according to claim 14, wherein when either of said first and second transistors is on, said signal output circuit sets said signal at said first logic level in a first period, and sets said signal to said second logic level in a second period other than said first period.

16. The semiconductor memory device according to claim 14, wherein said common line includes first and second signal lines;

said plurality of data write lines are connected alternately to said first and second signal lines;

said signal output circuit outputs, when either one of said first and second transistors is on, said signal and another signal complementary to said signal to said first and second signal lines, respectively; and each of said plurality of current drivers causes, when said current for data writing is caused to flow through an adjacent data write line, a prescribed current in a direction opposite to said current for data writing to flow through said corresponding data write line.

17. The semiconductor memory device according to claim 14, wherein each of said plurality of current drivers is connected to said corresponding data write line, at an end portion opposite to the current driver connected to an adjacent data write line;

said common line includes first and second signal lines provided on opposite sides of said plurality of data write lines, respectively;

said plurality of data write lines are connected alternately to said first and second signal lines;

when either one of said first and second transistors is on, said signal output circuit outputs said signal and another signal of the same phase as said signal to said first and second signal lines, respectively; and each of said plurality of current drivers causes, when said current for data writing is caused to flow through an adjacent data write line, a prescribed current in a direction opposite to said current for data writing to flow through said corresponding data write line.

18. The semiconductor memory device according to claim 14, wherein said plurality of memory cells are formed in at least one area;

each of said at least one area is divided into two blocks;

said common line includes at least one block common line provided corresponding to said at least one area, respectively; and each of said at least one block common line is shared by corresponding said two blocks.

19. The semiconductor memory device according to claim 14, wherein each of said plurality of memory cells has a magnetic layer magnetized in a direction corresponding to a stored data, and stores write data utilizing direction of magnetization of said magnetic layer determined by the direction of current caused to flow through the data write line to which the memory cell is connected, at the time of data writing.

20. The semiconductor memory device according to claim 14, further comprising:

a plurality of read bit lines provided corresponding to the columns of said plurality of memory cells, and receiving read data; wherein said plurality of data write lines are a plurality of write bit lines provided corresponding to the columns of said plurality of memory cells, and through which said current for data writing is caused to flow, generating a magnetic field to magnetize said magnetic layer.

21. A semiconductor memory device, comprising:

a plurality of memory cells arranged in a matrix of rows and columns;

a plurality of current drivers provided corresponding to the columns of said plurality of memory cells and receiving a voltage of a first power supply potential and a voltage of a second power supply potential lower than said first power supply potential; and a common line receiving a voltage of a third power supply potential lower than said first power supply potential and higher than said second power supply potential; wherein each of said plurality of current drivers includes a first transistor causing a current for data writing to flow in a direction from the current driver to said common line, based on potential difference between said first power supply potential and said third power supply potential applied to said common line, when a write data is of a first logic level, and a second transistor causing said current for data writing to flow in a direction from said common line to the current driver, based on potential difference between said third power supply potential applied to said common line and said second power supply potential, when said write data is of a second logic level complementary to said first logic level.

22. A semiconductor memory device, comprising:

a plurality of memory cells arranged in a matrix of rows and columns;

a plurality of current drivers provided corresponding to the columns of said plurality of memory cells and receiving a voltage of a first power supply potential and a voltage of a second power supply potential lower than said first power supply potential;

a signal output circuit receiving the voltages of said first and second power supply potentials, and outputting a signal having a first logic level and a second logic level complementary to said first logic level, indicated by said first and second power supply potentials respectively; and a common line connected to said signal output circuit and receiving said signal output from said signal output circuit; wherein each of said plurality of current drivers includes a first transistor causing a current for data writing to flow in a direction from the current driver to said common line, based on potential difference between said first power supply potential received by the current driver and said second power supply potential of said common line, when a write data has a first value and said signal is at said second logic level, and a second transistor causing said current for data writing to flow in a direction from said common line to the current driver, based on potential difference between said first power supply potential of said common line and said second power supply potential received by the current driver, when said write data is of a second value complementary to said first value and said signal is at said first logic level.

* * * * *